(12) United States Patent
Hsu et al.

(10) Patent No.: US 10,886,488 B2
(45) Date of Patent: Jan. 5, 2021

(54) DISPLAY DEVICE

(71) Applicant: Au Optronics Corporation, Hsinchu (TW)

(72) Inventors: Ya-Ting Hsu, Hsinchu (TW); Li-Chih Hsu, Taipei (TW); Chih-Ling Hsueh, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/293,650

(22) Filed: Mar. 6, 2019

(65) Prior Publication Data

US 2020/0161576 A1 May 21, 2020

(30) Foreign Application Priority Data

Nov. 21, 2018 (TW) .............................. 107141374 A

(51) Int. Cl.
*H01L 51/50* (2006.01)
*H01L 27/32* (2006.01)

(52) U.S. Cl.
CPC ........ *H01L 51/504* (2013.01); *H01L 27/3206* (2013.01); *H01L 27/3246* (2013.01); *H01L 27/3262* (2013.01)

(58) Field of Classification Search
CPC ............... H01L 51/504; H01L 51/5044; H01L 27/3209
See application file for complete search history.

(56) References Cited

U.S. PATENT DOCUMENTS 6,639,249 B2 * 10/2003 Valliath ................. H01L 27/156
257/88
6,936,856 B2 8/2005 Guenther et al.
9,368,760 B2 6/2016 Cho et al.
(Continued)

FOREIGN PATENT DOCUMENTS

CN 103439821 12/2013
CN 105140265 12/2015
(Continued)

*Primary Examiner* — Samuel A Gebremariam
*Assistant Examiner* — Jonas T Beardsley
(74) *Attorney, Agent, or Firm* — JCIPRNET

(57) ABSTRACT

A display device is provided. The display device includes a first substrate, a first element layer, a first light-emitting element layer, a second substrate, a second element layer, and a second light-emitting element layer. The first element layer is disposed on the first substrate and includes a first active element. The first light-emitting element layer is disposed on the first element layer and includes a first light-emitting element, the first light-emitting element is electrically connected to the first active element and includes a first light-emitting layer. The second substrate is disposed on the first light-emitting element. The second element layer is disposed on the second substrate and includes a second active element. The second light-emitting element layer is disposed on the second element layer and includes a second light-emitting element, the second light-emitting element is electrically connected to the second active element and includes a second light-emitting layer. The first light-emitting layer and the second light-emitting layer do not overlap with each other in the normal direction of the first substrate.

10 Claims, 8 Drawing Sheets

(56) References Cited

U.S. PATENT DOCUMENTS

| | | |
|---|---|---|
| 10,140,904 B2 | 11/2018 | Xu et al. |
| 2003/0132446 A1 | 7/2003 | Guenther et al. |
| 2011/0037081 A1* | 2/2011 | Kuo .................... H01L 25/0753 257/89 |
| 2011/0101383 A1* | 5/2011 | Hermann ............ H01L 25/0756 257/88 |
| 2014/0367652 A1 | 12/2014 | Cho et al. |
| 2015/0227172 A1 | 8/2015 | Namkung |
| 2017/0042047 A1 | 2/2017 | Oh |
| 2017/0076651 A1 | 3/2017 | Xu et al. |
| 2017/0104035 A1* | 4/2017 | Lee .................... H01L 51/0011 |
| 2019/0013305 A1* | 1/2019 | Chang ................ H01L 33/0075 |

FOREIGN PATENT DOCUMENTS

| | | |
|---|---|---|
| CN | 206353536 | 7/2017 |
| TW | 200304237 | 9/2003 |
| TW | 201507134 | 2/2015 |

* cited by examiner

DISPLAY DEVICE

CROSS-REFERENCE TO RELATED APPLICATION

This application claims the priority benefit of Taiwan application serial no. 107141374, filed on Nov. 21, 2018. The entirety of the above-mentioned patent application is hereby incorporated by reference herein and made a part of this specification.

BACKGROUND

Technical Field

The present invention relates to a display device, and more particularly to a display device having a multi-layer substrate.

Description of Related Art

In recent years, due to the advantages of self-luminous, wide viewing angle, power saving, simple program, low cost, wide operating temperature, high response speed, and full-color display, the organic light-emitting diode display has great potential to become the mainstream of the next generation of flat panel displays. With the continuous advancement of display technology, the resolution requirements of organic light-emitting diode displays are increasing, so that the image output can be visually closer to natural images. Therefore, how to improve the resolution of the organic light-emitting diode display has become one of the problems to be solved at present.

SUMMARY

The present invention provides a display device having improved resolution.

The display device of the present invention includes a first substrate, a first element layer, a first light-emitting element layer, a second substrate, a second element layer, a second light-emitting element layer, a third substrate, a third element layer, and a third light-emitting element layer. The first element layer is disposed on the first substrate and includes a first active element. The first light-emitting element layer is disposed on the first element layer, wherein the first light-emitting element layer includes a first light-emitting element electrically connected to the first active element and including a first light-emitting layer. The second substrate is disposed on the first light-emitting element. The second element layer is disposed on the second substrate and includes a second active element. The second light-emitting element layer is disposed on the second element layer, wherein the second light-emitting element layer includes a second light-emitting element electrically connected to the second active element and including the second light-emitting layer. The third substrate is disposed on the second light-emitting element. The third element layer is disposed on the third substrate and includes a third active element. The third light-emitting element layer is disposed on the third element layer, wherein the third light-emitting element layer includes a third light-emitting element electrically connected to the third active element and including a third light-emitting layer. The first light-emitting layer, the second light-emitting layer and the third light-emitting layer do not overlap with each other in a normal direction of the first substrate.

Based on the above, in the display device of the present invention, the first element layer is disposed on the first substrate and includes the first active element, the first light-emitting element layer is disposed on the first element layer and includes the first light-emitting element electrically connected to the first active element, the second substrate is disposed on the first light-emitting element, the second element layer is disposed on the second substrate and includes the second active element, the second light-emitting element layer is disposed on the second element layer and includes the second light-emitting element electrically connected to the second active element, the third substrate is disposed on the second light-emitting element, the third element layer is disposed on the third substrate and includes the third active element, the third light-emitting element layer is disposed on the third element layer and includes the third light-emitting element electrically connected to the third active element, and the first light-emitting layer of the first light-emitting element, the second light-emitting layer of the second light-emitting element and the third light-emitting layer of the third light-emitting element do not overlap with each other in the normal direction of the first substrate, whereby the display device may have improved resolution.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the present specification, a range represented by "a numerical value to another numerical value" is a schematic representation for avoiding listing all of the numerical values in the range in the specification. Therefore, the recitation of a specific numerical range covers any numerical value in the numerical range and a smaller numerical range defined by any numerical value in the numerical range, as is the case with the any numerical value and the smaller numerical range stated explicitly in the specification.

It should be understood that, although the terms "first", "second", "third", etc., may be used herein to describe various elements, components, regions, layers, sections and/or colors, these elements, components, regions, layers, sections and/or colors should not be limited by these terms. These terms are used to distinguish one element, component, region, layer, section or color from another element, component, region, layer, section or color.

In the figures, for clarity, the thicknesses of, for instance, layers, films, panels, and regions are enlarged. It should be understood that, when a layer, film, region, or an element of a substrate is "on" another element or "connected to" another element, the element may be directly on the other element or connected to the other element, or an intermediate element may be present. On the other hand, when an element is "directly on another element" or "directly connected to" another element, an intermediate element is not present. As used in the present specification, "connected to" may refer to a physical and/or electrical connection. Furthermore, "electrically connected" may mean that other elements are present between two elements.

Unless otherwise defined, all terms (including technical and scientific terms) used herein have the same meaning as commonly understood by persons of ordinary skill in the art. It will be further understood that terms, such as those defined in commonly used dictionaries, should be interpreted as having a meaning that is consistent with their meaning in the context of the relevant art and the disclosure and will not be interpreted in an idealized or overly formal sense unless expressly so defined herein.

Figure 1:
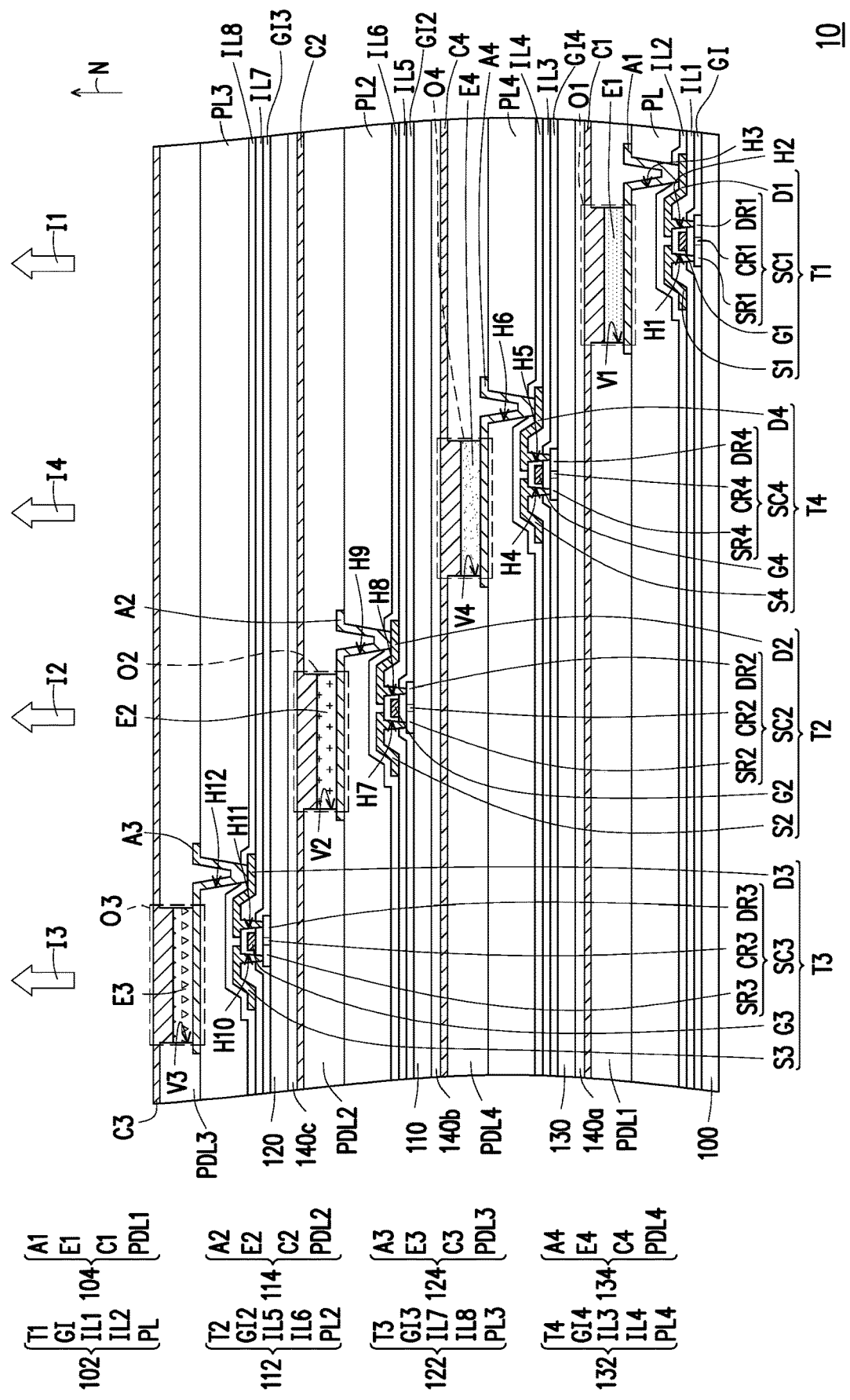
FIG. 1 is a schematic cross-sectional view of a display device in accordance with an embodiment of the present invention.
Figure 2:
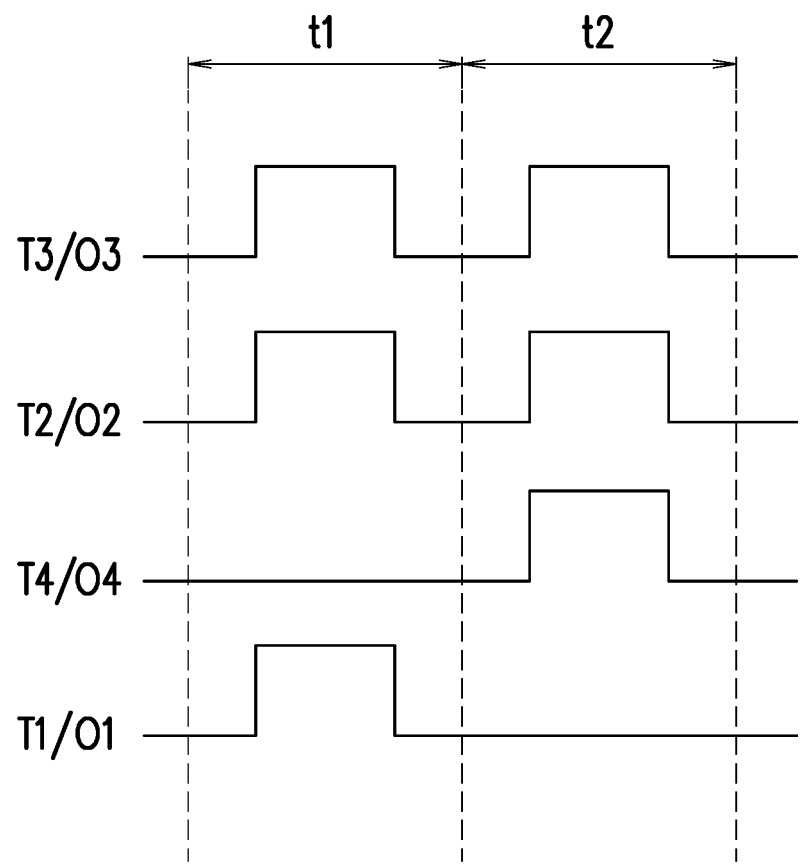
FIG. 2 is a schematic diagram of driving waveforms of the display device of FIG. 1.

FIG. 1 is a schematic cross-sectional view of a display device in accordance with an embodiment of the present invention. FIG. 2 is a schematic diagram of driving waveforms of the display device of FIG. 1.

Referring to FIG. 1, a display device 10 may include a first substrate 100, a first element layer 102, a first light-emitting element layer 104, a second substrate 110, a second element layer 112, a second light-emitting element layer 114, a third substrate 120, a third element layer 122 and a third light-emitting element layer 124. In addition, in the present embodiment, the display device 10 may selectively include a fourth substrate 130, a fourth element layer 132, a fourth light-emitting element layer 134, and adhesive layers 140a to 140c.

In this embodiment, the material of the first substrate 100 may include, but not limited to, glass, quartz, silicon oxide, silicon nitride, silicon oxynitride or an organic polymer, the organic polymer includes, for example, polyimide resin, epoxy resin or acrylic resin. In the present embodiment, the first substrate 100 has a single layer structure, but the present invention is not limited thereto. In other embodiments, the first substrate 100 may have a multilayer structure.

In the present embodiment, the first element layer 102 is disposed on the first substrate 100. In the present embodiment, the first element layer 102 may include a first active element T1, a gate insulating layer GI, an interlayer insulating layer IL1 an interlayer insulating layer IL2, and a planarization layer PL.

In this embodiment, the first active element T1 may include a semiconductor layer SC1, a gate G1, a source S1, and a drain D1. The semiconductor layer SC1 may include a source region SR1, a drain region DR1, and a channel region CR1. The gate G1 is located above the channel region CR1 and overlaps the channel region CR1, the source S1 is electrically connected to the source region SR1 via a contact window H1 formed in the gate insulating layer GI (described later in detail) and the interlayer insulating layer IL1 (described in detail later), and the drain D1 is electrically connected to the drain region DR1 via a contact window H2 formed in the gate insulating layer GI (described later in detail) and the interlayer insulating layer IL1 (described in detail later).

In the present embodiment, the first active element T1 belongs to the top gate type thin film transistor, but the present invention is not limited thereto. In other embodiments, the first active element T1 may belong to the bottom gate type thin film transistor.

In the present embodiment, the material of the gate G1, the source S1, and the drain D1 may include, but not limited to, metal, an alloy, a nitride of the foregoing material, an oxide of the foregoing material, an oxynitride of the foregoing material, other non-metallic materials with conductive properties, or other suitable materials. In the present embodiment, the material of the semiconductor layer SC1 may include a polysilicon, that is, the first active element T1 may be a low temperature poly-silicon thin film transistor (LTPS TFT). However, the invention does not limit the type of active elements. In other embodiments, the material of the semiconductor layer SC1 may include amorphous silicon, microcrystalline silicon, nanocrystalline silicon, single crystal silicon, organic semiconductor material, metal oxide semiconductor material, carbon nanotube/rod, perovskite or other suitable materials.

In the present embodiment, the gate insulating layer GI covers the semiconductor layer SC1. In the present embodiment, the interlayer insulating layer IL1 is disposed on the gate insulating layer GI and covers the gate G1. In the present embodiment, the interlayer insulating layer IL2 is disposed on the interlayer insulating layer IL1 and covers the first active element T1 to provide insulation and protection functions. In the present embodiment, the planarization layer PL is disposed on the interlayer insulating layer IL2 to provide protection function and ensure planarization. In the present embodiment, the gate insulating layer GI, the interlayer insulating layer IL1 the interlayer insulating layer IL2, and the planarization layer PL may each have a single layer structure or a multilayer structure. In the present embodiment, the materials of the gate insulating layer GI, the interlayer insulating layer IL1 the interlayer insulating layer IL2, and the planarization layer PL may respectively include an inorganic material, an organic material, or other suitable materials, wherein the inorganic material includes, for example, but not limited to: silicon oxide, silicon nitride or silicon oxynitride; the organic material includes, for example, but not limited to: polyimide resin, epoxy resin or acrylic resin.

In the present embodiment, the first light-emitting element layer 104 is disposed on the first element layer 102. In the present embodiment, the first light-emitting element layer 104 may include an electrode A1, a first light-emitting layer E1, an electrode C1, and a pixel definition layer PDL1.

In the present embodiment, the electrode A1 is electrically connected to the drain D1 of the first active element T1 through a contact window H3 formed in the interlayer insulating layer IL2 and the planarization layer PL. In this embodiment, the material of the electrode A1 may be a transparent conductive material or an opaque conductive material. The transparent conductive material may include a metal oxide conductive material such as indium tin oxide, indium zinc oxide, aluminum tin oxide, aluminum zinc oxide, indium gallium zinc oxide, other suitable oxides, or stacked layers of at least two of the above materials. The opaque conductive material may include a metallic material such as aluminum, magnesium, titanium or alloys thereof.

In the present embodiment, the first light-emitting layer E1 is located within a opening V1 of the pixel definition layer PDL1, but the present invention is not limited thereto. In other embodiments, the first light-emitting layer E1 may be located within the opening V1 of the pixel definition layer PDL1 and on the pixel definition layer PDL1. In the present embodiment, the color of the first light-emitting layer E1 is a first blue color. In the present embodiment, the first light-emitting layer E1 may be composed of any material known to those skilled in the art for the light-emitting layer in the display panel.

In the present embodiment, the electrode C1 is disposed on the first light-emitting layer E1. In the present embodiment, the first light-emitting layer E1 is disposed between the electrode A1 and the electrode C1. In this embodiment, the material of the electrode C1 may be a transparent conductive material or an opaque conductive material. The transparent conductive material may include a metal oxide conductive material such as indium tin oxide, indium zinc oxide, aluminum tin oxide, aluminum zinc oxide, indium antimony zinc oxide, other suitable oxides, or stacked layers of at least two of the above materials. The opaque conductive material may include a metallic material such as aluminum, magnesium, titanium or alloys thereof.

In the present embodiment, the first light-emitting layer E1, the portion of the electrode A1 overlapping with the first light-emitting layer E1, and the portion of the electrode C1 overlapping with the first light-emitting layer E1 constitute the first light-emitting element O1. In the present embodiment, the portion of the electrode A1 overlapping with the first light-emitting layer E1 serves as an anode of the first light-emitting element O1, and the portion of the electrode C1 overlapping with the first light-emitting layer E1 serves as a cathode of the first light-emitting element O1, but the present invention is not limited thereto. In other embodiments, the portion of the electrode A1 overlapping the first light-emitting layer E1 may serve as a cathode of the first light-emitting element O1, and the portion of the electrode C1 overlapping the first light-emitting layer E1 may serve as an anode of the first light-emitting element O1.

As described above, in the present embodiment, the electrode A1 is electrically connected to the drain D1 of the first active element T1, so that the first active element T1 is electrically connected to the first light-emitting element O1 for driving the first light-emitting element O1. Specifically, the first light-emitting element O1 emits light by driving the first light-emitting layer E1 through the voltage difference generated between the electrode A1 and the electrode C1. As described above, the color of the first light-emitting layer E1 is the first blue color, so that the first light-emitting element O1 is driven to emit a first blue light I1.

In addition, although FIG. 1 only shows one first active element T1 electrically connected to the first light-emitting element O1, it should be understood by those of ordinary skill in the art that the first light-emitting element O1 is actually driven by, for example, a driving unit having a 1T1C architecture, a 2T1C architecture, a 3T1C architecture, a 3T2C architecture, a 4T1C architecture, a 4T2C architecture, a 5T1C architecture, a 5T2C architecture, a 6T1C architecture, a 6T2C architecture, a 7T2C architecture or any possible architecture. That is, in the present embodiment, the first active element T1 is one element in the driving unit for driving the first light-emitting element O1.

In the present embodiment, the material of the pixel definition layer PDL1 may include a photosensitive polyimide material, a propylene-based material, a siloxane material, a phenolic resin material, an oxide, a nitride or an oxynitride, but the present invention is not limited thereto.

In the present embodiment, the fourth substrate 130 is disposed on the first light-emitting element layer 104. That is, in the present embodiment, the fourth substrate 130 is stacked on the first substrate 100, the first element layer 102, and the first light-emitting element layer 104 in the normal direction N of the first substrate 100. In this embodiment, the material of the fourth substrate 130 may include, but not limited to, glass, quartz, silicon oxide, silicon nitride, silicon oxynitride or an organic polymer, the organic polymer includes, for example, polyimide resin, epoxy resin or acrylic resin. In the present embodiment, the fourth substrate 130 has a single layer structure, but the present invention is not limited thereto. In other embodiments, the fourth substrate 130 may have a multilayer structure.

In the present embodiment, the fourth element layer 132 is disposed on the fourth substrate 130. In the present embodiment, the fourth element layer 132 may include a fourth active element T4, a gate insulating layer GI4, an interlayer insulating layer IL3, an interlayer insulating layer IL4, and a planarization layer PL4.

In this embodiment, the fourth active element T4 may include a semiconductor layer SC4, a gate G4, a source S4, and a drain D4. The semiconductor layer SC4 may include a source region SR4, a drain region DR4, and a channel region CR4. The gate G4 is located above the channel region CR4 and overlaps the channel region CR4, and the source S4 is electrically connected to the source region SR4 via a contact window H4 formed in the gate insulating layer GI4 (described later in detail) and the interlayer insulating layer IL3 (described in detail later), and the drain D4 is electrically connected to the drain region DR4 via a contact window H5 formed in the gate insulating layer GI4 (described later in detail) and the interlayer insulating layer IL3 (described in detail later).

In the present embodiment, the fourth active element T4 belongs to the top gate type thin film transistor, but the present invention is not limited thereto. In other embodiments, the fourth active element T4 may belong to the bottom gate type thin film transistor.

In the present embodiment, the material of the gate G4, the source S4, and the drain D4 may include, but not limited to, metal, an alloy, a nitride of the foregoing material, an oxide of the foregoing material, an oxynitride of the foregoing material, other non-metallic materials with conductive properties, or other suitable materials. In this embodiment, the material of the semiconductor layer SC4 may include polysilicon, that is, the fourth active element T4 may be a low temperature poly-silicon thin film transistor (LIPS TFT). However, the invention does not limit the type of active elements. In other embodiments, the material of the semiconductor layer SC4 may include amorphous silicon, microcrystalline silicon, nanocrystalline silicon, single crystal silicon, organic semiconductor material, metal oxide semiconductor material, carbon nanotube/rod, perovskite or other suitable materials.

In the present embodiment, the gate insulating layer GI4 covers the semiconductor layer SC4. In the present embodiment, the interlayer insulating layer IL3 is disposed on the gate insulating layer GI4 and covers the gate G4. In the present embodiment, the interlayer insulating layer IL4 is disposed on the interlayer insulating layer IL3 and covers the fourth active element T4 to provide insulation and protection functions. In the present embodiment, the planarization layer PL4 is disposed on the interlayer insulating layer IL4 to provide protection function and ensure planarization. In the present embodiment, the gate insulating layer GI4, the interlayer insulating layer IL3, the interlayer insulating layer IL4, and the planarization layer PL4 may each have a single layer structure or a multilayer structure. In the present embodiment, the materials of the gate insulating layer GI4, the interlayer insulating layer IL3, the interlayer insulating layer IL4, and the planarization layer PL4 may respectively include an inorganic material, an organic material, or other suitable materials, wherein the inorganic material includes, for example, but not limited to: silicon oxide, silicon nitride or silicon oxynitride; the organic material includes, for example, but not limited to: polyimide resin, epoxy resin or acrylic resin.

In the present embodiment, the fourth light-emitting element layer 134 is disposed on the fourth element layer 132. In the present embodiment, the fourth light-emitting element layer 134 may include an electrode A4, a fourth light-emitting layer E4, an electrode C4, and a pixel definition layer PDL4.

In the present embodiment, the electrode A4 is electrically connected to the drain D4 of the fourth active element T4 through a contact window H6 formed in the interlayer insulating layer IL4 and the planarization layer PL4. In this embodiment, the material of the electrode A4 may be a transparent conductive material or an opaque conductive material. The transparent conductive material may include a metal oxide conductive material such as indium tin oxide, indium zinc oxide, aluminum tin oxide, aluminum zinc oxide, indium gallium zinc oxide, other suitable oxides, or stacked layers of at least two of the above materials. The opaque conductive material may include a metallic material such as aluminum, magnesium, titanium or alloys thereof.

In the present embodiment, the fourth light-emitting layer E4 is located within a opening V4 of the pixel definition layer PDL4, but the present invention is not limited thereto. In other embodiments, the fourth light-emitting layer E4 may be located within the opening V4 of the pixel definition layer PDL4 and on the pixel definition layer PDL4. In the present embodiment, the fourth light-emitting layer E4 does not overlap the first light-emitting layer E1 in the normal direction N of the first substrate 100. That is, in the present embodiment, the opening V4 of the pixel definition layer PDL4 does not overlap the opening V1 of the pixel definition layer PDL1 in the normal direction N of the first substrate 100.

In the present embodiment, the color of the fourth light-emitting layer E4 is a second blue color. It should be noted that in the present embodiment, the chromaticity of the second blue color of the fourth light-emitting layer E4 is different from the chromaticity of the first blue color of the first light-emitting layer E1. That is, in the present embodiment, the material of the fourth light-emitting layer E4 is different from the material of the first light-emitting layer E1. For example, in an embodiment, the chromaticity of the first blue color of the first light-emitting layer E1 is higher than the chromaticity of the second blue color of the fourth light-emitting layer E4, and the lifetime of the first light-emitting layer E1 is lower than the lifetime of the fourth light-emitting layer E4. Further, in the present embodiment, the fourth light-emitting layer E4 may be composed of any material known to those skilled in the art for a light-emitting layer in a display panel.

In the present embodiment, the electrode C4 is disposed on the fourth light-emitting layer E4. In the present embodiment, the fourth light-emitting layer E4 is disposed between the electrode A4 and the electrode C4. In this embodiment, the material of the electrode C4 may be a transparent conductive material or an opaque conductive material. The transparent conductive material may include a metal oxide conductive material such as indium tin oxide, indium zinc oxide, aluminum tin oxide, aluminum zinc oxide, indium antimony zinc oxide, other suitable oxides, or stacked layers of at least two of the above materials. The opaque conductive material may include a metallic material such as aluminum, magnesium, titanium or alloys thereof.

In the present embodiment, the fourth light-emitting layer E4, the portion of the electrode A4 overlapping with the fourth light-emitting layer E4, and the portion of the electrode C4 overlapping with the fourth light-emitting layer E4 constitute the fourth light-emitting element O4. In the present embodiment, the portion of the electrode A4 overlapping with the fourth light-emitting layer E4 serves as an anode of the fourth light-emitting element O4, and the portion of the electrode C4 overlapping with the fourth light-emitting layer E4 serves as a cathode of the fourth light-emitting element O4, but the present invention is not limited thereto. In other embodiments, the portion of the electrode A4 overlapping with the fourth light-emitting layer E4 may serve as a cathode of the fourth light-emitting element O4, and the portion of the electrode C4 overlapping with the fourth light-emitting layer E4 may serve as an anode of the fourth light-emitting element O4.

As described above, in the present embodiment, the electrode A4 is electrically connected to the drain D4 of the fourth active element T4, so that the fourth active element T4 is electrically connected to the fourth light-emitting element O4 for driving the fourth light-emitting element O4. Specifically, the fourth light-emitting element O4 emits light by driving the fourth light-emitting layer E4 through the voltage difference generated between the electrode A4 and the electrode C4. As described above, the color of the fourth light-emitting layer E4 is the second blue color, so that the fourth light-emitting element O4 is driven to emit a second blue light I4, wherein the first blue light I1 emitted by the first light-emitting element O1 is different from the second blue light I4 emitted by the fourth light-emitting element O4.

In addition, although FIG. 1 only shows a fourth active element T4 electrically connected to the fourth light-emitting element O4, it should be understood by those of ordinary skill in the art that the fourth light-emitting element O4 is actually driven by, for example, a driving unit having a 1T1C architecture, a 2T1C architecture, a 3T1C architecture, a 3T2C architecture, a 4T1C architecture, a 4T2C architecture, a 5T1C architecture, a 5T2C architecture, a 6T1C architecture, a 6T2C architecture, a 7T2C architecture or any possible architecture. That is, in the present embodiment, the fourth active element T4 is one element in the driving unit for driving the fourth light-emitting element O4.

In the present embodiment, the material of the pixel definition layer PDL4 may include a photosensitive polyimide material, a propylene-based material, a siloxane material, a phenolic resin material, an oxide, a nitride or an oxynitride, but the present invention is not limited thereto.

In the present embodiment, the adhesive layer 140a is disposed between the first light-emitting element layer 104 and the fourth substrate 130. That is, in the present embodiment, the fourth substrate 130 is adhered and fixed to the first light-emitting element layer 104 through the adhesive layer 140a. In addition, in the embodiment, the adhesive layer 140a may be a continuous adhesive layer, wherein the material of the adhesive layer may include, but not limited to, a photo-curable adhesive (SVR), an optical clear adhesive (OCA) or other adhesive materials.

In the present embodiment, the second substrate 110 is disposed on the fourth light-emitting element layer 134. That is, in the present embodiment, the second substrate 110 is stacked on the first substrate 100, the first element layer 102, the first light-emitting element layer 104, the fourth substrate 130, the fourth element layer 132 and the fourth light-emitting element layer 134 in the normal direction N of the first substrate 100. From another point of view, in the present embodiment, the fourth substrate 130, the fourth element layer 132, and the fourth light-emitting element layer 134 are located between the first light-emitting element layer 104 and the second substrate 110. In addition, in this embodiment, the material of the second substrate 110 may include, but not limited to, glass, quartz, silicon oxide, silicon nitride, silicon oxynitride or an organic polymer, the organic polymer includes, for example, polyimide resin, epoxy resin or acrylic resin. In the present embodiment, the second substrate 110 has a single layer structure, but the present invention is not limited thereto. In other embodiments, the second substrate 110 may have a multilayer structure.

In the present embodiment, the second element layer 112 is disposed on the second substrate 110. In the present embodiment, the second element layer 112 may include a second active element T2, a gate insulating layer GI2, an interlayer insulating layer IL5, an interlayer insulating layer IL6, and a planarization layer PL2.

In this embodiment, the second active element T2 may include a semiconductor layer SC2, a gate G2, a source S2, and a drain D2. The semiconductor layer SC2 may include a source region SR2, a drain region DR2, and a channel region CR2. The gate G2 is located above the channel region CR2 and overlaps the channel region CR2, and the source S2 is electrically connected to the source region SR2 via a contact window H7 formed in the gate insulating layer GI2 (described later in detail) and the interlayer insulating layer IL5 (described in detail later), and the drain D2 is electrically connected to the drain region DR2 via a contact window H8 formed in the gate insulating layer GI2 (described later in detail) and the interlayer insulating layer IL5 (described in detail later).

In the present embodiment, the second active element T2 belongs to the top gate type thin film transistor, but the present invention is not limited thereto. In other embodiments, the second active element T2 may belong to the bottom gate type thin film transistor.

In the present embodiment, the material of the gate G2, the source S2, and the drain D2 may include, but not limited to, metal, an alloy, a nitride of the foregoing material, an oxide of the foregoing material, an oxynitride of the foregoing material, other non-metallic materials with conductive properties, or other suitable materials. In this embodiment, the material of the semiconductor layer SC2 may include polysilicon, that is, the second active element T2 may be a low temperature poly-silicon thin film transistor. However, the invention does not limit the type of active elements. In other embodiments, the material of the semiconductor layer SC2 may include amorphous silicon, microcrystalline silicon, nanocrystalline silicon, single crystal silicon, organic semiconductor material, metal oxide semiconductor material, carbon nanotube/rod, perovskite or other suitable materials.

In the present embodiment, the gate insulating layer GI2 covers the semiconductor layer SC2. In the present embodiment, the interlayer insulating layer IL5 is disposed on the gate insulating layer GI2 and covers the gate G2. In the present embodiment, the interlayer insulating layer IL6 is disposed on the interlayer insulating layer IL5 and covers the second active element T2 to provide insulation and protection functions. In the present embodiment, the planarization layer PL2 is disposed on the interlayer insulating layer IL6 to provide protection function and ensure planarization. In the present embodiment, the gate insulating layer GI2, the interlayer insulating layer IL5, the interlayer insulating layer IL6, and the planarization layer PL2 may each have a single layer structure or a multilayer structure. In the present embodiment, the materials of the gate insulating layer GI2, the interlayer insulating layer IL5, the interlayer insulating layer IL6, and the planarization layer PL2 may respectively include an inorganic material, an organic material, or other suitable materials, wherein the inorganic material includes, for example, but not limited to: silicon oxide, silicon nitride or silicon oxynitride; the organic material includes, for example, but not limited to: polyimide resin, epoxy resin or acrylic resin.

In the present embodiment, the second light-emitting element layer 114 is disposed on the second element layer 112. In the present embodiment, the second light-emitting element layer 114 may include an electrode A2, a second light-emitting layer E2, an electrode C2, and a pixel definition layer PDL2.

In the present embodiment, the electrode A2 is electrically connected to the drain D2 of the second active element T2 through a contact window H9 formed in the interlayer insulating layer IL6 and the planarization layer PL2. In this embodiment, the material of the electrode A2 may be a transparent conductive material or an opaque conductive material. The transparent conductive material may include a metal oxide conductive material such as indium tin oxide, indium zinc oxide, aluminum tin oxide, aluminum zinc oxide, indium gallium zinc oxide, other suitable oxides, or stacked layers of at least two of the above materials. The opaque conductive material may include a metallic material such as aluminum, magnesium, titanium or alloys thereof.

In the present embodiment, the second light-emitting layer E2 is located within a opening V2 of the pixel definition layer PDL2, but the present invention is not limited thereto. In other embodiments, the second light-emitting layer E2 may be located within the opening V2 of the pixel definition layer PDL2 and on the pixel definition layer PDL2. In the present embodiment, the second light-emitting layer E2, the fourth light-emitting layer E4 and the first light-emitting layer E1 do not overlap with each other in the normal direction N of the first substrate 100. That is, in the present embodiment, in the normal direction N of the first substrate 100, the opening V2 of the pixel definition layer PDL2, the opening V4 of the pixel definition layer PDL4, and the opening V1 of the pixel definition layer PDL1 do not overlap with each other. In the present embodiment, the color of the second light-emitting layer E2 is a green color. In the present embodiment, the second light-emitting layer E2 may be composed of any material known to those skilled in the art for the light-emitting layer in the display panel.

In the present embodiment, the electrode C2 is disposed on the second light-emitting layer E2. In the present embodiment, the second light-emitting layer E2 is disposed between the electrode A2 and the electrode C2. In this embodiment, the material of the electrode C2 may be a transparent conductive material or an opaque conductive material. The transparent conductive material may include a metal oxide conductive material such as indium tin oxide, indium zinc oxide, aluminum tin oxide, aluminum zinc oxide, indium antimony zinc oxide, other suitable oxides, or stacked layers of at least two of the above materials. The opaque conductive material may include a metallic material such as aluminum, magnesium, titanium or alloys thereof.

In the present embodiment, the second light-emitting layer E2, the portion of the electrode A2 overlapping with the second light-emitting layer E2, and the portion of the electrode C2 overlapping with the second light-emitting layer E2 constitute the second light-emitting element O2. In the present embodiment, the portion of the electrode A2 overlapping with the second light-emitting layer E2 serves as an anode of the second light-emitting element O2, and the portion of the electrode C2 overlapping with the second light-emitting layer E2 serves as a cathode of the second light-emitting element O2, but the present invention is not limited thereto. In other embodiments, the portion of the electrode A2 overlapping with the second light-emitting layer E2 may serve as a cathode of the second light-emitting element O2, and the portion of the electrode C2 overlapping with the second light-emitting layer E2 may serve as an anode of the second light-emitting element O2.

As described above, in the present embodiment, the electrode A2 is electrically connected to the drain D2 of the second active element T2, so that the second active element T2 is electrically connected to the second light-emitting element O2 for driving the second light-emitting element O2. Specifically, the second light-emitting element O2 emits light by driving the second light-emitting layer E2 through the voltage difference generated between the electrode A2 and the electrode C2. As described above, the color of the second light-emitting layer E2 is the green color, so that the second light-emitting element O2 is driven to emit a green light I2.

In addition, although FIG. 1 only shows one second active element T2 electrically connected to the second light-emitting element O2, it should be understood by those of ordinary skill in the art that the second light-emitting element O2 is actually driven by, for example, a driving unit having a 1T1C architecture, a 2T1C architecture, a 3T1C architecture, a 3T2C architecture, a 4T1C architecture, a 4T2C architecture, a 5T1C architecture, a 5T2C architecture, a 6T1C architecture, a 6T2C architecture, a 7T2C architecture or any possible architecture. That is, in the present embodiment, the second active element T2 is one element in the driving unit for driving the second light-emitting element O2.

In the present embodiment, the material of the pixel definition layer PDL2 may include a photosensitive polyimide material, a propylene-based material, a siloxane material, a phenolic resin material, an oxide, a nitride or an oxynitride, but the present invention is not limited thereto.

In the present embodiment, the adhesive layer 140b is disposed between the fourth light-emitting element layer 134 and the second substrate 110. That is, in the present embodiment, the second substrate 110 is adhered and fixed to the fourth light-emitting element layer 134 through the adhesive layer 140b. In addition, in the embodiment, the adhesive layer 140b may be a continuous adhesive layer, wherein the material of the adhesive layer may include, but not limited to, a photo-curable adhesive, an optical clear adhesive or other adhesive materials.

In the present embodiment, the third substrate 120 is disposed on the second light-emitting element layer 114. That is, in the present embodiment, the third substrate 120 is stacked on the first substrate 100, the first element layer 102, the first light-emitting element layer 104, the fourth substrate 130, the fourth element layer 132, the fourth light-emitting element layer 134, the second substrate 110, the second element layer 112, and the second light-emitting element layer 114 in the normal direction N of the first substrate 100. From another point of view, in the present embodiment, the second substrate 110, the second element layer 112, and the second light-emitting element layer 114 are located between the fourth light-emitting element layer 134 and the third substrate 120. In addition, in the present embodiment, the material of the third substrate 120 may include, but not limited to, glass, quartz, silicon oxide, silicon nitride, silicon oxynitride or an organic polymer, the organic polymer includes, for example, polyimide resin, an epoxy resin or an acrylic resin. In the present embodiment, the third substrate 120 has a single layer structure, but the present invention is not limited thereto. In other embodiments, the third substrate 120 may have a multilayer structure.

In the present embodiment, the third element layer 122 is disposed on the third substrate 120. In the present embodiment, the third element layer 122 may include a third active element T3, a gate insulating layer GI3, an interlayer insulating layer IL7, an interlayer insulating layer IL8, and a planarization layer PL3.

In this embodiment, the third active element T3 may include a semiconductor layer SC3, a gate G3, a source S3, and a drain D3. The semiconductor layer SC3 may include a source region SR3, a drain region DR3, and a channel region CR3. The gate G3 is located above the channel region CR3 and overlaps the channel region CR3, and the source S3 is electrically connected to the source region SR3 via a contact window H10 formed in the gate insulating layer GI3 (described later in detail) and the interlayer insulating layer IL7 (described in detail later), and the drain D3 is electrically connected to the drain region DR3 via a contact window H11 formed in the gate insulating layer GI3 (described later in detail) and the interlayer insulating layer IL7 (described in detail later).

In the present embodiment, the third active element T3 belongs to the top gate type thin film transistor, but the present invention is not limited thereto. In other embodiments, the third active element T3 may belong to the bottom gate type thin film transistor.

In the present embodiment, the material of the gate G3, the source S3, and the drain D3 may include, but not limited to, metal, an alloy, a nitride of the foregoing material, an oxide of the foregoing material, an oxynitride of the foregoing material, other non-metallic materials with conductive properties, or other suitable materials. In this embodiment, the material of the semiconductor layer SC3 may include polysilicon, that is, the third active element T3 may be a low temperature poly-silicon thin film transistor. However, the invention does not limit the type of active elements. In other embodiments, the material of the semiconductor layer SC3 may include amorphous silicon, microcrystalline silicon, nanocrystalline silicon, single crystal silicon, organic semiconductor material, metal oxide semiconductor material, carbon nanotube/rod, perovskite or other suitable materials.

In the present embodiment, the gate insulating layer GI3 covers the semiconductor layer SC3. In the present embodiment, the interlayer insulating layer IL7 is disposed on the gate insulating layer GI3 and covers the gate G3. In the present embodiment, the interlayer insulating layer IL8 is disposed on the interlayer insulating layer IL7 and covers the third active element T3 to provide insulation and protection functions. In the present embodiment, the planarization layer PL3 is disposed on the interlayer insulating layer IL8 to provide protection function and ensure planarization. In the present embodiment, the gate insulating layer GI3, the interlayer insulating layer IL7, the interlayer insulating layer IL8, and the planarization layer PL3 may each have a single layer structure or a multilayer structure. In the present embodiment, the materials of the gate insulating layer GI3, the interlayer insulating layer IL7, the interlayer insulating layer IL8, and the planarization layer PL3 may respectively include an inorganic material, an organic material, or other suitable materials, wherein the inorganic material includes, for example, but not limited to: silicon oxide, silicon nitride or silicon oxynitride; the organic material includes, for example, but not limited to: polyimide resin, epoxy resin or acrylic resin.

In the present embodiment, the third light-emitting element layer 124 is disposed on the third element layer 122. In the present embodiment, the third light-emitting element layer 124 may include an electrode A3, a third light-emitting layer E3, an electrode C3, and a pixel definition layer PDL3.

In the present embodiment, the electrode A3 is electrically connected to the drain D3 of the third active element T3 through a contact window H12 formed in the interlayer insulating layer IL8 and the planarization layer PL3. In this embodiment, the material of the electrode A3 may be a transparent conductive material or an opaque conductive material. The transparent conductive material may include a metal oxide conductive material such as indium tin oxide, indium zinc oxide, aluminum tin oxide, aluminum zinc oxide, indium gallium zinc oxide, other suitable oxides, or stacked layers of at least two of the above materials. The opaque conductive material may include a metallic material such as aluminum, magnesium, titanium or alloys thereof.

In the present embodiment, the third light-emitting layer E3 is located within a opening V3 of the pixel definition layer PDL3, but the present invention is not limited thereto. In other embodiments, the third light-emitting layer E3 may be located within the opening V3 of the pixel definition layer PDL3 and on the pixel definition layer PDL3. In the present embodiment, the color of the third light-emitting layer E3 is a red color. In the present embodiment, the third light-emitting layer E3 may be composed of any material known to those skilled in the art for the light-emitting layer in the display panel.

In the present embodiment, the electrode C3 is disposed on the third light-emitting layer E3. In the present embodiment, the third light-emitting layer E3 is disposed between the electrode A3 and the electrode C3. In this embodiment, the material of the electrode C3 may be a transparent conductive material or an opaque conductive material. The transparent conductive material may include a metal oxide conductive material such as indium tin oxide, indium zinc oxide, aluminum tin oxide, aluminum zinc oxide, indium antimony zinc oxide, other suitable oxides, or stacked layers of at least two of the above materials. The opaque conductive material may include a metallic material such as aluminum, magnesium, titanium or alloys thereof.

In the present embodiment, the third light-emitting layer E3, the portion of the electrode A3 overlapping with the third light-emitting layer E3, and the portion of the electrode C3 overlapping with the third light-emitting layer E3 constitute the third light-emitting element O3. In the present embodiment, the portion of the electrode A3 overlapping with the third light-emitting layer E3 serves as an anode of the third light-emitting element O3, and the portion of the electrode C3 overlapping with the third light-emitting layer E3 serves as a cathode of the third light-emitting element O3, but the present invention is not limited thereto. In other embodiments, the portion of the electrode A3 overlapping with the third light-emitting layer E3 may serve as a cathode of the third light-emitting element O3, and the portion of the electrode C3 overlapping with the third light-emitting layer E3 may serve as an anode of the third light-emitting element O3.

As described above, in the present embodiment, the electrode A3 is electrically connected to the drain D3 of the third active element T3, so that the third active element T3 is electrically connected to the third light-emitting element O3 for driving the third light-emitting element O3. Specifically, the third light-emitting element O3 emits light by driving the third light-emitting layer E3 through the voltage difference generated between the electrode A3 and the electrode C3. As described above, the color of the third light-emitting layer E3 is the red color, so that the third light-emitting element O3 is driven to emit a red light I3.

In addition, although FIG. 1 only shows one third active element T3 electrically connected to the third light-emitting element O3, it should be understood by those of ordinary skill in the art that the third light-emitting element O3 is actually driven by, for example, a driving unit having a 1T1C architecture, a 2T1C architecture, a 3T1C architecture, a 3T2C architecture, a 4T1C architecture, a 4T2C architecture, a 5T1C architecture, a 5T2C architecture, a 6T1C architecture, a 6T2C architecture, a 7T2C architecture or any possible architecture. That is, in the present embodiment, the third active element T3 is one element in the driving unit for driving the third light-emitting element O3.

In the present embodiment, the material of the pixel definition layer PDL3 may include a photosensitive polyimide material, a propylene-based material, a siloxane material, a phenolic resin material, an oxide, a nitride or an oxynitride, but the present invention is not limited thereto.

In the present embodiment, the adhesive layer 140c is disposed between the second light-emitting element layer 114 and the third substrate 120. That is, in the present embodiment, the third substrate 120 is adhered and fixed to the second light-emitting element layer 114 through the adhesive layer 140c. In addition, in the embodiment, the adhesive layer 140c may be a continuous adhesive layer, wherein the material of the adhesive layer may include, but not limited to, a photo-curable adhesive, an optical clear adhesive or other adhesive materials.

It should be noted that, in this embodiment, the display device 10 includes the first substrate 100, the first element layer 102, the first light-emitting element layer 104, the second substrate 110, the second element layer 112, the second light-emitting element layer 114, the third substrate 120, the third element layer 122, and the third light-emitting element layer 124 which are sequentially stacked, wherein the first element layer 102 includes the first active element T1, the first light-emitting element layer 104 includes the first light-emitting element O1 electrically connected to the first active element T1 and including the first light-emitting layer E1, the second element layer 112 includes the second active element T2, the second light-emitting element layer 114 includes the second light-emitting element O2 electrically connected to the second active element T2 and including the light-emitting layer E2, the third element layer 122 includes the third active element T3, the third light-emitting element layer 124 includes the third light-emitting element O3 electrically connected to the third active element T3 and including the third light-emitting layer E3, and in the normal direction N of the first substrate 100, the first light-emitting layer E1, the second light-emitting layer E2 and the third light-emitting layer E3 do not overlap with each other, whereby the display device 10 may have improved resolution.

In addition, the display device 10 includes the fourth light-emitting element O4 electrically connected to the fourth active element T4, wherein the chromaticity of the second blue color of the fourth light-emitting layer E4 included in the fourth light-emitting element O4 is different from the chromaticity of the first blue color of the first light-emitting layer E1, so that the display device 10 can be driven by a time division technique, thereby extending the lifetime of the display device 10. Hereinafter, the driving method of the display device 10 will be described with further reference to FIG. 2.

Referring to both of FIG. 2 and FIG. 1, during a frame time t1, a turn-on signal is input respectively to the first active element T1, the second active element T2, and the third active element T3, so that the first light-emitting element O1, the second light-emitting element O2 and the third light-emitting element O3 are respectively driven to emit the first blue light I1, the green light I2, and the red light I3 via the turned-on first active element T1, the turned-on second active element T2, and the turned-on third active element T3. At this time, the fourth active element T4 is not turned on, and the first blue light I1, the green light I2, and the red light I3 are mixed to form a white light. During a frame time t2, a turn-on signal is input respectively to the fourth active element T4, the second active element T2, and the third active element T3, so that the fourth light-emitting element O4, the second light-emitting element O2, and the third light-emitting element O3 are respectively driven to emit the second blue light I4, the green light I2, and the red light I3 via the turned-on fourth active element T4, the turned-on second active element T2, and the turned-on third active element T3. At this time, the first active element T1 is not turned on, and the second blue light I4, the green light I2, and the red light I3 are mixed to form a white light. As a result, although the first light-emitting layer E1 and the fourth light-emitting layer E4 (i.e. the first blue light-emitting layer and the second blue light-emitting layer) have a problem of limited lifetime due to material properties, the display device 10 includes both of the first light-emitting layer E1 and the fourth light-emitting layer E4, so when the display device 10 is driven by the time division technique, the lifetime of the display device 10 may be effectively extended.

In addition, in the display device 10, the color of the first light-emitting layer E1 is the first blue color, the color of the fourth light-emitting layer E4 is the second blue color, the color of the second light-emitting layer E2 is the green color, and the color of the third light-emitting layer E3 is the red color, and since the energy of the blue wavelength light is the strongest, the light transmittance of the display device 10 is optimized by placing the light-emitting layer which would emit the blue wavelength light (i.e. the first light-emitting layer E1 and the fourth light-emitting layer E4) at the lower location. However, the present invention is not limited thereto. In other embodiments, the arrangements of the color of the first light-emitting layer E1, the color of the fourth light-emitting layer E4, the color of the second light-emitting layer E2, and the color of the third light-emitting layer E3 may be implemented by other arrangements of the first blue color, the second blue color, the green color and the red color.

In addition, in the display device 10, the fourth light-emitting element O4 includes the fourth light-emitting layer E4, the portion of the electrode A4 overlapping with the fourth light-emitting layer E4, and the portion of the electrode C4 overlapping with the fourth light-emitting layer E4, wherein the chromaticity of the color of the fourth light-emitting layer E4 is different from the chromaticity of the color of the first light-emitting layer E1, but the present invention is not limited thereto. In other embodiments, the color of the first light-emitting layer E1 may be the same as the color of the fourth light-emitting layer E4. Hereinafter, other embodiments will be described with reference to FIG. 3. It should be mentioned here that, the embodiments below adopt the reference numerals of the embodiments above and a portion of the content thereof, wherein the same or similar reference numerals are used to represent the same or similar elements and descriptions of the same technical content are omitted. The omitted portions are described in the previous embodiments and are not repeated in the following embodiments.

Figure 3:
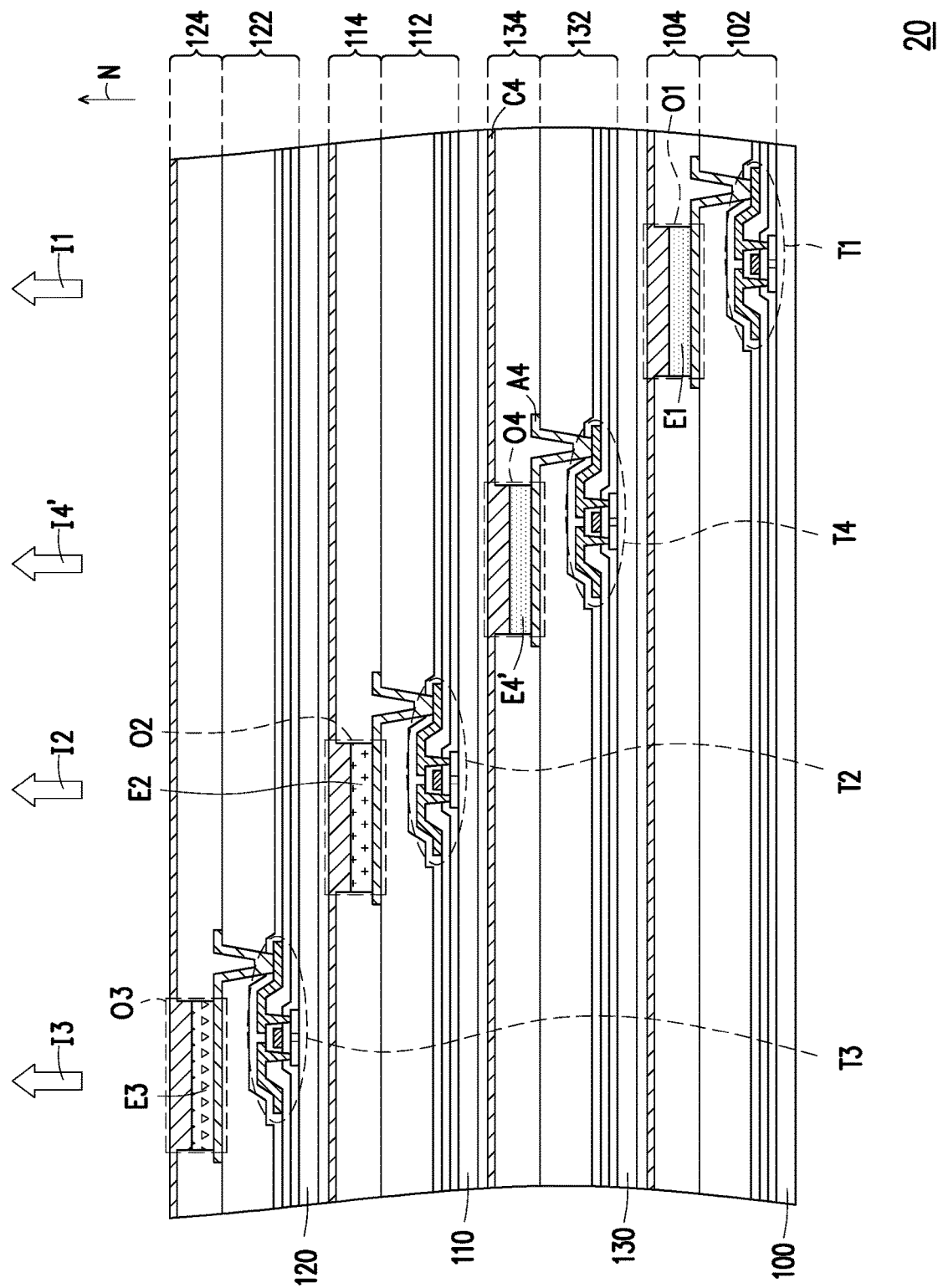
FIG. 3 is a schematic cross-sectional view of a display device in accordance with another embodiment of the present invention.

FIG. 3 is a schematic cross-sectional view of a display device in accordance with another embodiment of the present invention. Referring to both FIG. 3 and FIG. 1, the display device 20 of FIG. 3 is similar to the display device 10 of FIG. 1, and the main difference is that in the display device 20, the fourth light-emitting element O4 includes a fourth light-emitting layer E4' the portion of the electrode A4 overlapping with the fourth light-emitting layer E4' and the portion of the electrode C4 overlapping with the fourth light-emitting layer E4'. The differences between the display device 20 of FIG. 3 and the display device 10 of FIG. 1 will be described below, and the same or similar elements are denoted by the same or similar reference numerals, and the descriptions of the same technical content are omitted. The omitted portions are described in the previous embodiments and are not repeated in the following embodiments.

Referring to FIG. 3, in the present embodiment, the color of the fourth light-emitting layer E4' is the first blue color. That is, in the present embodiment, the color of the fourth light-emitting layer E4' is the same as the color of the first light-emitting layer E1, and the color of the fourth light-emitting layer E4' is different from the color of the second light-emitting layer E2 and the color of the third light-emitting layer E3. Moreover, since the color of the fourth light-emitting layer E4' is the first blue color, the fourth light-emitting element O4 is driven by the fourth driving element T4 to emit a first blue light I4', wherein the first blue light I1 emitted by the first light-emitting element O1 is the same as the first blue light I4'.

Although the first light-emitting layer E1 and the fourth light-emitting layer E4' (i.e. the blue light-emitting layer) have a problem of limited lifetime due to material properties, the display device 20 includes both of the first light-emitting layer E1 and the fourth light-emitting layers E4', so when the display device 20 is driven by the time division technique, the lifetime of the display device 20 may be effectively extended.

In the display device 20, the color of the first light-emitting layer E1 is the first blue color, the color of the fourth light-emitting layer E4' is the first blue color, the color of the second light-emitting layer E2 is the green color, and the color of the third light-emitting layer E3 is the red color, and since the energy of the blue wavelength light is the strongest, the light transmittance of the display device 20 is optimized by placing the light-emitting layer which would emit the blue wavelength light (i.e. the first light-emitting layer E1 and the fourth light-emitting layer E4') at the lower location. However, the present invention is not limited thereto. In other embodiments, the arrangements of the color of the first light-emitting layer E1, the color of the fourth light-emitting layer E4', the color of the second light-emitting layer E2, and the color of the third light-emitting layer E3 may be implemented by other arrangements of the first blue color, the first blue color, the green color and the red color. For the rest, please refer to the foregoing embodiments, and details are not described herein.

In addition, the display device 10 includes four light-emitting elements, i.e. the first light-emitting element O1, the second light-emitting element O2, the third light-emitting element O3 and the fourth light-emitting element O4, but the present invention is not limited thereto. Hereinafter, other embodiments will be described with reference to FIG. 4 and FIGS. 6 to 9. It should be mentioned here that, the embodiments below adopt the reference numerals of the embodiments above and a portion of the content thereof, wherein the same or similar reference numerals are used to represent the same or similar elements and descriptions of the same technical content are omitted. The omitted portions are described in the previous embodiments and are not repeated in the following embodiments.

Figure 4:
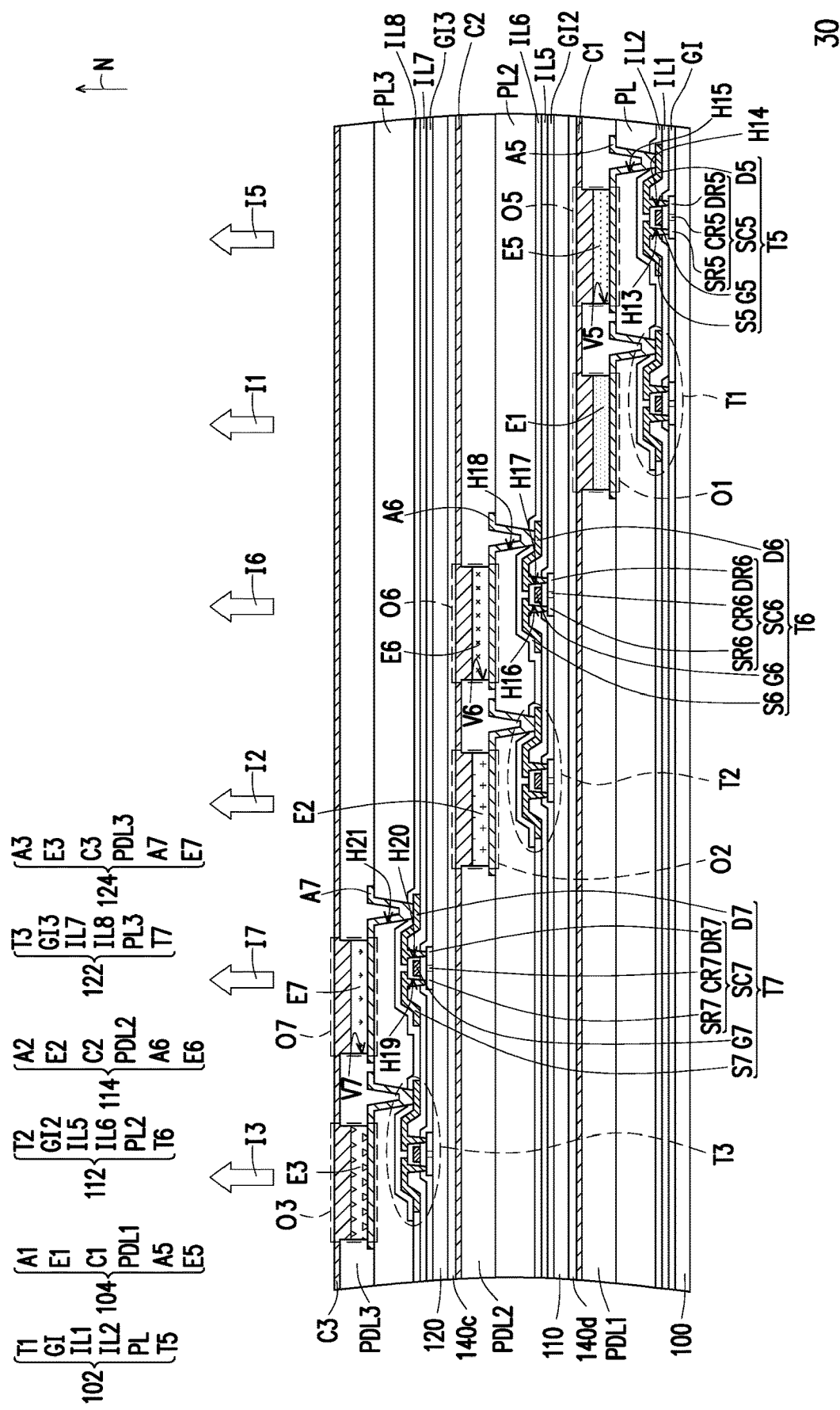
FIG. 4 is a schematic cross-sectional view of a display device in accordance with another embodiment of the present invention.
Figure 5:
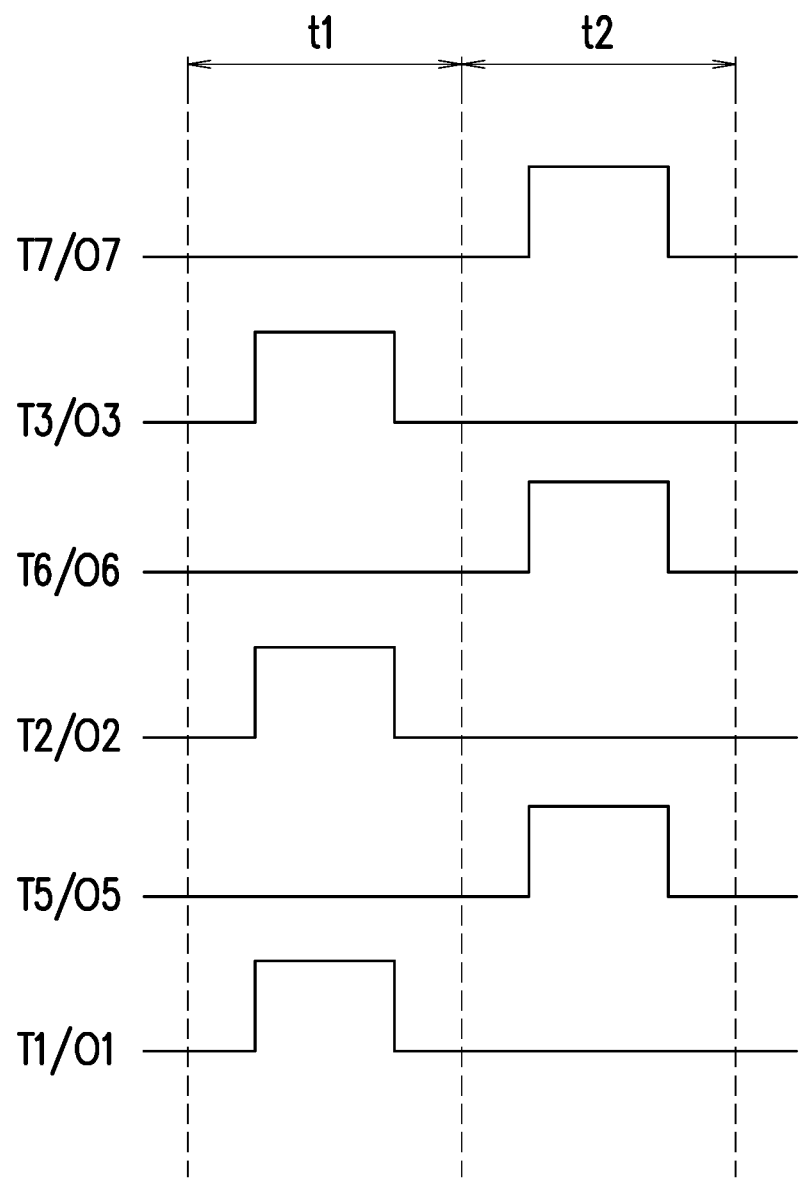
FIG. 5 is a schematic diagram of driving waveforms of the display device of FIG. 4.

FIG. 4 is a schematic cross-sectional view of a display device in accordance with another embodiment of the present invention. FIG. 5 is a schematic diagram of driving waveforms of the display device of FIG. 4. Referring to both FIG. 4 and FIG. 1, the display device 30 of FIG. 4 is similar to the display device 10 of FIG. 1, and the main difference is that the display device 30 includes six light-emitting elements, i.e. the first light-emitting element O1, the second light-emitting element O2, the third light-emitting element O3, a fourth light-emitting element O5, a fifth light-emitting element O6, and a sixth light-emitting element O7. The differences between the display device 30 of FIG. 4 and the display device 10 of FIG. 1 will be described below, and the same or similar elements are denoted by the same or similar reference numerals, and the descriptions of the same technical content are omitted. The omitted portions are described in the previous embodiments and are not repeated in the following embodiments.

Referring to FIG. 4, in the embodiment, the first element layer 102 may include a fourth active element T5. In this embodiment, the fourth active element T5 may include a semiconductor layer SC5, a gate G5, a source S5, and a drain D5. The semiconductor layer SC5 may include a source region SR5, a drain region DR5, and a channel region CR5. The gate G5 is located above the channel region CR5 and overlaps the channel region CR5. The source S5 is electrically connected to the source region SR5 via a contact window H13 formed in the gate insulating layer GI and the interlayer insulating layer IL1 and the drain D5 is electrically connected to the drain region DR5 via a contact window H14 formed in the gate insulating layer GI and the interlayer insulating layer IL1.

In the present embodiment, the fourth active element T5 belongs to the top gate type thin film transistor, but the present invention is not limited thereto. In other embodiments, the fourth active element T5 may belong to the bottom gate type thin film transistor.

In the present embodiment, the material of the gate G5, the source S5, and the drain D5 may include, but not limited to, metal, an alloy, a nitride of the foregoing material, an oxide of the foregoing material, an oxynitride of the foregoing material, other non-metallic materials with conductive properties, or other suitable materials. In this embodiment, the material of the semiconductor layer SC5 may include polysilicon, that is, the fourth active element T5 may be a low temperature poly-silicon thin film transistor. However, the invention does not limit the type of active elements. In other embodiments, the material of the semiconductor layer SC5 may include amorphous silicon, microcrystalline silicon, nanocrystalline silicon, single crystal silicon, organic semiconductor material, metal oxide semiconductor material, carbon nanotube/rod, perovskite or other suitable materials. In the present embodiment, the gate insulating layer GI covers the semiconductor layer SC5. In the present embodiment, the interlayer insulating layer IL1 covers the gate G5. In the present embodiment, the interlayer insulating layer IL2 covers the fourth active element T5.

In the present embodiment, the first light-emitting element layer 104 may include an electrode A5 and a fourth light-emitting layer E5. In the present embodiment, the electrode A5 is electrically connected to the drain D5 of the fourth active element T5 through a contact window H15 formed in the interlayer insulating layer IL2 and the planarization layer PL. In this embodiment, the material of the electrode A5 may be a transparent conductive material or an opaque conductive material. The transparent conductive material may include a metal oxide conductive material such as indium tin oxide, indium zinc oxide, aluminum tin oxide, aluminum zinc oxide, indium gallium zinc oxide, other suitable oxides, or stacked layers of at least two of the above materials. The opaque conductive material may include a metallic material such as aluminum, magnesium, titanium or alloys thereof.

In the present embodiment, the fourth light-emitting layer E5 is located within a opening V5 of the pixel definition layer PDL1, but the present invention is not limited thereto. In other embodiments, the fourth light-emitting layer E5 may be located within the opening V5 of the pixel definition layer PDL1 and on the pixel definition layer PDL1. In the present embodiment, the color of the fourth light-emitting layer E5 is a magenta color. In the present embodiment, the fourth light-emitting layer E5 may be composed of any material known in the art for a light-emitting layer in a display panel. Further, in the present embodiment, the fourth light-emitting layer E5 is disposed between the electrode A5 and the electrode C1.

In the present embodiment, the fourth light-emitting layer E5, the portion of the electrode A5 overlapping with the fourth light-emitting layer E5, and the portion of the electrode C1 overlapping with the fourth light-emitting layer constitute the fourth light-emitting element O5. In the present embodiment, the portion of the electrode A5 overlapping with the fourth light-emitting layer E5 serves as an anode of the fourth light-emitting element O5, and the portion of the electrode C1 overlapping with the fourth light-emitting layer E5 serves as a cathode of the fourth light-emitting element O5, but the present invention is not limited thereto. In other embodiments, the portion of the electrode A5 overlapping with the fourth light-emitting layer E5 may serve as a cathode of the fourth light-emitting element O5, and the portion of the electrode C1 overlapping with the fourth light-emitting layer E5 may serve as an anode of the fourth light-emitting element O5.

As described above, in the present embodiment, the electrode A5 is electrically connected to the drain D5 of the fourth active element T5, so that the fourth active element T5 is electrically connected to the fourth light-emitting element O5 for driving the fourth light-emitting element O5. Specifically, the fourth light-emitting element O5 emits light by driving the fourth light-emitting layer E5 through the voltage difference generated between the electrode A5 and the electrode C1. As described above, the color of the fourth light-emitting layer E5 is the magenta color, so that the fourth light-emitting element O5 is driven to emit a magenta light I5.

In addition, although FIG. 4 only shows one fourth active element T5 electrically connected to the fourth light-emitting element O5, it should be understood by those of ordinary skill in the art that the fourth light-emitting element O5 is actually driven by, for example, a driving unit having a 1T1C architecture, a 2T1C architecture, a 3T1C architecture, a 3T2C architecture, a 4T1C architecture, a 4T2C architecture, a 5T1C architecture, a 5T2C architecture, a 6T1C architecture, a 6T2C architecture, a 7T2C architecture or any possible architecture. That is, in the present embodiment, the fourth active element T5 is one element in the driving unit for driving the fourth light-emitting element O5.

In the present embodiment, the second element layer 112 may include a fifth active element T6. In this embodiment, the fifth active element T6 may include a semiconductor layer SC6, a gate G6, a source S6, and a drain D6. The semiconductor layer SC6 may include a source region SR6, a drain region DR6, and a channel region CR6. The gate G6 is located above the channel region CR6 and overlaps the channel region CR6, and the source S6 is electrically connected to the source region SR6 via a contact window H16 formed in the gate insulating layer GI2 and the interlayer insulating layer IL5, and the drain D6 is electrically connected to the drain region DR6 via a contact window H17 formed in the gate insulating layer GI2 and the interlayer insulating layer IL5.

In the present embodiment, the fifth active element T6 belongs to the top gate type thin film transistor, but the present invention is not limited thereto. In other embodiments, the fifth active element T6 may belong to the bottom gate type thin film transistor.

In the present embodiment, the material of the gate G6, the source S6, and the drain D6 may include, but not limited to, metal, an alloy, a nitride of the foregoing material, an oxide of the foregoing material, an oxynitride of the foregoing material, other non-metallic materials with conductive properties, or other suitable materials. In this embodiment, the material of the semiconductor layer SC6 may include polysilicon, that is, the fifth active element T6 may be a low temperature poly-silicon thin film transistor. However, the invention does not limit the type of active elements. In other embodiments, the material of the semiconductor layer SC6 may include amorphous silicon, microcrystalline silicon, nanocrystalline silicon, single crystal silicon, organic semiconductor material, metal oxide semiconductor material, carbon nanotube/rod, perovskite or other suitable materials. In the present embodiment, the gate insulating layer GI2 covers the semiconductor layer SC6. In the present embodiment, the interlayer insulating layer IL5 covers the gate G6. In the present embodiment, the interlayer insulating layer IL6 covers the fifth active element T6.

In the present embodiment, the second light-emitting element layer 114 may include an electrode A6 and a fifth light-emitting layer E6. In the present embodiment, the electrode A6 is electrically connected to the drain D6 of the fifth active element T6 through a contact window H18 formed in the interlayer insulating layer IL6 and the planarization layer PL2. In this embodiment, the material of the electrode A6 may be a transparent conductive material or an opaque conductive material. The transparent conductive material may include a metal oxide conductive material such as indium tin oxide, indium zinc oxide, aluminum tin oxide, aluminum zinc oxide, indium gallium zinc oxide, other suitable oxides, or stacked layers of at least two of the above materials. The opaque conductive material may include a metallic material such as aluminum, magnesium, titanium or alloys thereof.

In the present embodiment, the fifth light-emitting layer E6 is located within a opening V6 of the pixel definition layer PDL2, but the present invention is not limited thereto. In other embodiments, the fifth light-emitting layer E6 may be located within the opening V6 of the pixel definition layer PDL2 and on the pixel definition layer PDL2. In the present embodiment, the color of the fifth light-emitting layer E6 is a cyan color. In the present embodiment, the fifth light-emitting layer E6 may be composed of any material known to those skilled in the art for the light-emitting layer in the display panel. Further, in the present embodiment, the fifth light-emitting layer E6 is disposed between the electrode A6 and the electrode C2.

In the present embodiment, the fifth light-emitting layer E6, the portion of the electrode A6 overlapping with the fifth light-emitting layer E6, and the portion of the electrode C2 overlapping with the fifth light-emitting layer E6 constitute the fifth light-emitting element O6. In the present embodiment, the portion of the electrode A6 overlapping with the fifth light-emitting layer E6 serves as an anode of the fifth light-emitting element O6, and the portion of the electrode C2 overlapping with the fifth light-emitting layer E6 serves as a cathode of the fifth light-emitting element O6, but the present invention is not limited thereto. In other embodiments, the portion of the electrode A5 overlapping with the fifth light-emitting layer E6 may serve as a cathode of the fifth light-emitting element O6, and the portion of the electrode C2 overlapping with the fifth light-emitting layer E6 may serve as an anode of the fifth light-emitting element O6.

As described above, in the present embodiment, the electrode A6 is electrically connected to the drain D6 of the fifth active element T6, so that the fifth active element T6 is electrically connected to the fifth light-emitting element O6 for driving the fifth light-emitting element O6. Specifically, the fifth light-emitting element O6 emits light by driving the fifth light-emitting layer E6 through the voltage difference generated between the electrode A6 and the electrode C2. As described above, the color of the fifth light-emitting layer E6 is the cyan color, so that the fifth light-emitting element O6 is driven to emit a cyan light I6.

In addition, although FIG. 4 only shows one fifth active element T6 electrically connected to the fifth light-emitting element O6, it should be understood by those of ordinary skill in the art that the fifth active element T6 is actually driven by, for example, a driving unit having a 1T1C architecture, a 2T1C architecture, a 3T1C architecture, a 3T2C architecture, a 4T1C architecture, a 4T2C architecture, a 5T1C architecture, a 5T2C architecture, a 6T1C architecture, a 6T2C architecture, a 7T2C architecture or any possible architecture. That is, in the present embodiment, the fifth active element T6 is one element in the driving unit for driving the fifth light-emitting element O6.

In the present embodiment, the third element layer 122 may include a sixth active element T7. In this embodiment, the sixth active element T7 may include a semiconductor layer SC7, a gate G7, a source S7, and a drain D7, wherein the semiconductor layer SC7 may include a source region SR7, a drain region DR7, and a channel region CR7. The gate G7 is located above the channel region CR7 and overlaps the channel region CR7, and the source S7 is electrically connected to the source region SR7 via a contact window H19 formed in the gate insulating layer GI3 and the interlayer insulating layer IL7, and the drain D7 is electrically connected to the drain region DR7 via a contact window H20 formed in the gate insulating layer GI3 and the interlayer insulating layer IL7.

In the present embodiment, the sixth active element T7 belongs to the top gate type thin film transistor, but the present invention is not limited thereto. In other embodiments, the sixth active element T7 may belong to the bottom gate type thin film transistor.

In the present embodiment, the material of the gate G7, the source S7, and the drain D7 may include, but not limited to, metal, an alloy, a nitride of the foregoing material, an oxide of the foregoing material, an oxynitride of the foregoing material, other non-metallic materials with conductive properties, or other suitable materials. In this embodiment, the material of the semiconductor layer SC7 may include polysilicon, that is, the sixth active element T7 may be a low temperature poly-silicon thin film transistor. However, the invention does not limit the type of active elements. In other embodiments, the material of the semiconductor layer SC7 may include amorphous silicon, microcrystalline silicon, nanocrystalline silicon, single crystal silicon, organic semiconductor material, metal oxide semiconductor material, carbon nanotube/rod, perovskite or other suitable materials. In the present embodiment, the gate insulating layer GI3 covers the semiconductor layer SC7. In the present embodiment, the interlayer insulating layer IL7 covers the gate G7. In the present embodiment, the interlayer insulating layer IL8 covers the sixth active element T7.

In the present embodiment, the third light-emitting element layer 124 may include an electrode A7 and a sixth light-emitting layer E7. In the present embodiment, the electrode A7 is electrically connected to the drain D7 of the sixth active element T7 through a contact window H21 formed in the interlayer insulating layer IL8 and the planarization layer PL3. In this embodiment, the material of the electrode A7 may be a transparent conductive material or an opaque conductive material. The transparent conductive material may include a metal oxide conductive material such as indium tin oxide, indium zinc oxide, aluminum tin oxide, aluminum zinc oxide, indium gallium zinc oxide, other suitable oxides, or stacked layers of at least two of the above materials. The opaque conductive material may include a metallic material such as aluminum, magnesium, titanium or alloys thereof.

In the present embodiment, the sixth light-emitting layer E7 is located within a opening V7 of the pixel definition layer PDL3, but the present invention is not limited thereto. In other embodiments, the sixth light-emitting layer E7 may be located within the opening V7 of the pixel definition layer PDL3 and on the pixel definition layer PDL3. In the present embodiment, the color of the sixth light-emitting layer E7 is a yellow color. As described above, the color of the first light-emitting layer E1 is the blue color, the color of the second light-emitting layer E2 is the green color, the color of the third light-emitting layer E3 is the red color, the color of the fourth light-emitting layer E5 is the magenta color, and the color of the fifth light-emitting layer E6 is the cyan color. Therefore, in the present embodiment, the color of the first light-emitting layer E1, the color of the second light-emitting layer E2, the color of the third light-emitting layer E3, the color of the fourth light-emitting layer E5, the color of the fifth light-emitting layer E6 and the color of the sixth light-emitting layer E7 are different from each other. In the present embodiment, the sixth light-emitting layer E7 may be composed of any material known to those skilled in the art for the light-emitting layer in the display panel.

In the present embodiment, in the normal direction N of the first substrate 100, the first light-emitting layer E1, the second light-emitting layer E2, the third light-emitting layer E3, the fourth light-emitting layer E5, the fifth light-emitting layer E6, and the sixth light-emitting layers E7 do not overlap with each other. In addition, in the present embodiment, the first light-emitting layer E1 and the fourth light-emitting layer E5 are arranged side by side in the first light-emitting element layer 104, the second light-emitting layer E2 and the fifth light-emitting layer E6 are arranged side by side in the second light-emitting element layer 114, and the third light-emitting layer E3 and the sixth light-emitting layer E7 are arranged side by side in the third light-emitting element layer 124.

In the present embodiment, the sixth light-emitting layer E7 is disposed between the electrode A7 and the electrode C3. Further, in the present embodiment, the sixth light-emitting layer E7, the portion of the electrode A7 overlapping with the sixth light-emitting layer E7, and the portion of the electrode C3 overlapping with the sixth light-emitting layer E7 constitute the sixth light-emitting element O7. In the present embodiment, the portion of the electrode A7 overlapping with the sixth light-emitting layer E7 serves as an anode of the sixth light-emitting element O7, and the portion of the electrode C3 overlapping with the sixth light-emitting layer E7 serves as a cathode of the sixth light-emitting element O7, but the present invention is not limited thereto. In other embodiments, the portion of the electrode A7 overlapping with the sixth light-emitting layer E7 may serve as a cathode of the sixth light-emitting element O7, and the portion of the electrode C3 overlapping with the sixth light-emitting layer E7 may serve as an anode of the sixth light-emitting element O7.

As described above, in the present embodiment, the electrode A7 is electrically connected to the drain D7 of the sixth active element T7, so that the sixth active element T7 is electrically connected to the sixth light-emitting element O7 for driving the sixth light-emitting element O7. Specifically, the sixth light-emitting element O7 emits light by driving the sixth light-emitting layer E7 through the voltage difference generated between the electrode A7 and the electrode C3. As described above, the color of the sixth light-emitting layer E7 is the yellow color, so that the sixth light-emitting element O7 is driven to emit a yellow light I6.

In addition, although FIG. 4 only shows one sixth active element T7 electrically connected to the sixth light-emitting element O7, it should be understood by those of ordinary skill in the art that the sixth active element T7 is actually driven by, for example, a driving unit having a 1T1C architecture, a 2T1C architecture, a 3T1C architecture, a 3T2C architecture, a 4T1C architecture, a 4T2C architecture, a 5T1C architecture, a 5T2C architecture, a 6T1C architecture, a 6T2C architecture, a 7T2C architecture or any possible architecture. That is, in the present embodiment, the sixth active element T7 is one element in the driving unit for driving the sixth light-emitting element O7.

In the present embodiment, the display device 30 may include an adhesive layer 140d. In the present embodiment, the adhesive layer 140d is disposed between the first light-emitting element layer 104 and the second substrate 110. That is, in the present embodiment, the second substrate 110 is adhered and fixed to the first light-emitting element layer 104 through the adhesive layer 140d. In addition, in the embodiment, the adhesive layer 140d may be a continuous adhesive layer, wherein the material of the adhesive layer may include, but not limited to, a photo-curable adhesive, an optical clear adhesive or other adhesive materials.

In the present embodiment, the display device 30 includes the first light-emitting layer E1, the second light-emitting layer E2, the third light-emitting layer E3, the fourth light-emitting layer E5, the fifth light-emitting layer E6 and the sixth light-emitting layer E7 which the colors thereof respectively are the blue color, the green color, the red color, the magenta color, the cyan color, and the yellow color, thereby the effect of improving the wide color gamut is achieved.

In addition, in the display device 30, the colors of the first light-emitting layer E1 and the fourth light-emitting layer E5 included in the first light-emitting element layer 104 respectively are the blue color and the magenta color, the colors of the second light-emitting layer E2 and the fifth light-emitting layer E6 included in the second light-emitting element layer 114 are respectively the green color and the cyan color, and the colors of the third light-emitting layer E3 and the sixth light-emitting layer E7 included in the third light-emitting element layer 124 are respectively the red color and the yellow color, and since the energy of the blue wavelength light is the strongest, the light transmittance of the display device 30 is optimized by placing the light-emitting layer which would emit the blue wavelength light (i.e. the first light-emitting layer E1) at the lower location. However, the present invention is not limited thereto. In other embodiments, the arrangements of the color of the first light-emitting layer E1, the color of the second light-emitting layer E2, the color of the third light-emitting layer E3, the color of the fourth light-emitting layer E5, the color of the five light-emitting layers E6 and the color of the sixth light-emitting layer E7 may be implemented by other arrangements of the blue color, the green color, the red color, the magenta color, the cyan color, and the yellow color.

In addition, the display device 30 includes the fourth light-emitting element O5 electrically connected to the fourth active element T5, the fifth light-emitting element O6 electrically connected to the fifth active element T6 and sixth light-emitting element O7 electrically connected to the sixth active element T7, wherein the fourth light-emitting layer E5 included in the fourth light-emitting element O5 is the magenta light-emitting layer, the fifth light-emitting layer E6 included in the fifth light-emitting element O6 is the cyan light-emitting layer, and the sixth light-emitting layer E7 included in the sixth light-emitting element O7 is the yellow light-emitting layer, so that the display device 30 may be driven by the time division technique, thereby extending the lifetime of the display device 30. Hereinafter, the driving method of the display device 30 will be described with further reference to FIG. 5.

Referring to both FIG. 5 and FIG. 4, during a the frame time t1, a turn-on signal is input respectively to the first active element T1, the second active element T2, and the third active element T3, so that the first light-emitting element O1, the second light-emitting element O2 and the third light-emitting element O3 are respectively driven to emit the blue light I1, the green light I2, and the red light I3 via the turned-on first active element T1, the turned-on second active element T2, and the turned-on third active element T3. At this time, the fourth active element T5, the fifth active element T6, and the sixth active element T7 are not turned on, and the blue light I1, the green light I2, and the red light I3 are mixed to form a white light. During a frame time t2, the turn-on signal is input respectively to the fourth active element T5, the fifth active element T6, and the sixth active element T7, so that the fourth light-emitting element O5, the fifth light-emitting element O6, and the sixth light-emitting element O7 are respectively driven to emit the magenta light I5, the cyan I6, and the yellow light I7 via the turned-on fourth active element T5, the turned-on fifth active element T6, and the turned-on sixth active element T7. At this time, the first active element T1, the second active element T2, and the third active element T3 are not turned on, and the magenta light I5, the cyan I6, and the yellow light I7 are mixed to form a white light. In this way, even if the first light-emitting layer E1 (i.e. the blue light-emitting layer) has a problem of limited lifetime due to material properties, the display device 30 includes the fourth light-emitting layer E5, the fifth light-emitting layer E6 and the sixth light-emitting layer E7, so that when the display device 30 is driven the time division technique, the lifetime of the display device 30 may be effectively extended. For the rest, please refer to the foregoing embodiments, and details are not described herein.

In addition, in the display device 30, in the normal direction N of the first substrate 100, the first light-emitting layer E1, the second light-emitting layer E2, the third light-emitting layer E3, the fourth light-emitting layer E5, the fifth light-emitting layer E6, and the sixth light-emitting layers E7 do not overlap with each other, but the present invention is not limited thereto. Hereinafter, other embodiments will be described with reference to FIG. 6. It should be mentioned here that, the embodiments below adopt the reference numerals of the embodiments above and a portion of the content thereof, wherein the same or similar reference numerals are used to represent the same or similar elements and descriptions of the same technical content are omitted. The omitted portions are described in the previous embodiments and are not repeated in the following embodiments.

Figure 6:
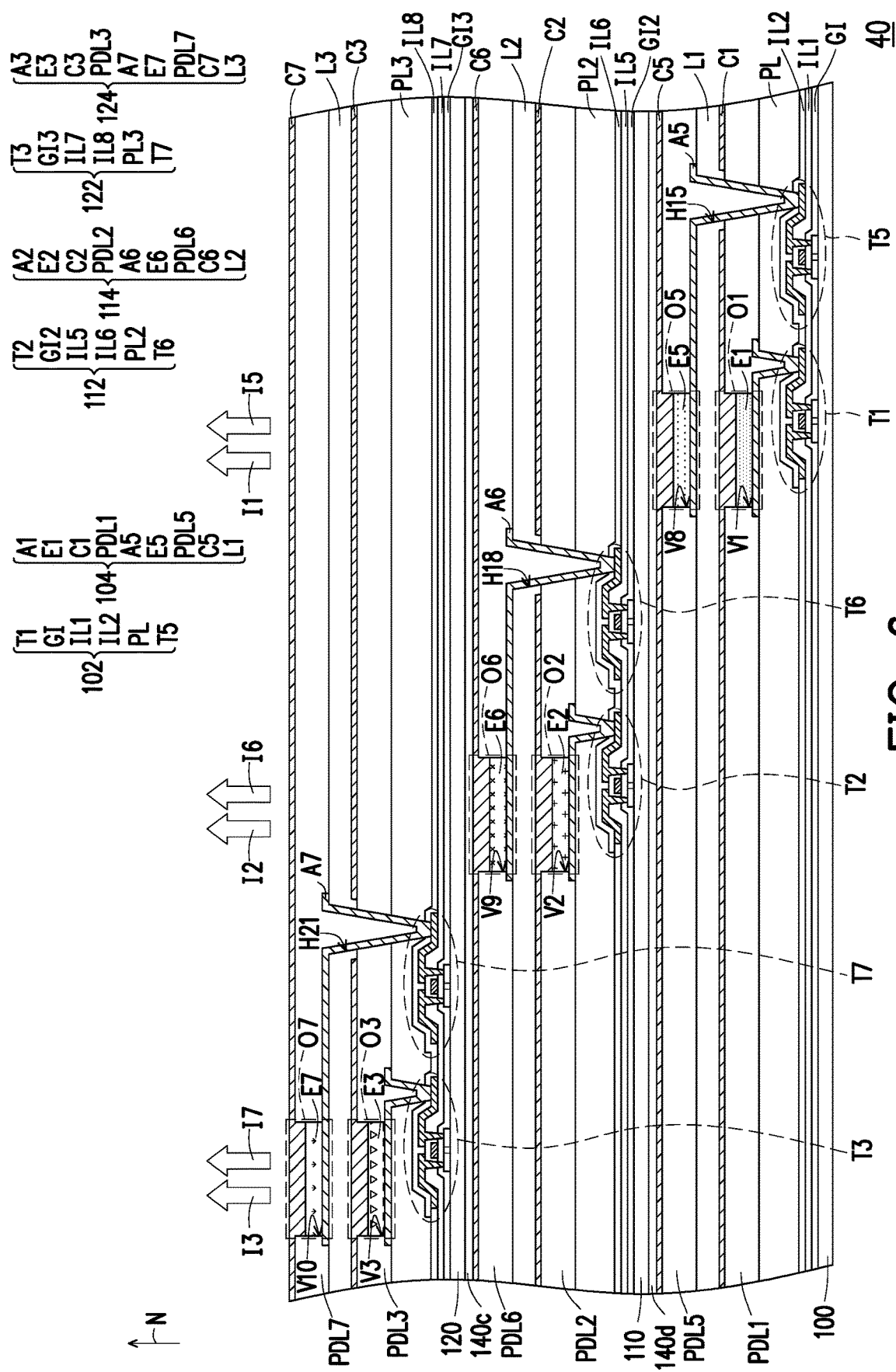
FIG. 6 is a schematic cross-sectional view of a display device in accordance with another embodiment of the present invention.

FIG. 6 is a schematic cross-sectional view of a display device in accordance with another embodiment of the present invention. Referring to both FIG. 6 and FIG. 4, the display device 40 of FIG. 6 is similar to the display device 30 of FIG. 4, and the main difference is that in the display device 40, in the normal direction N of the first substrate 100, the first light-emitting layer E1 overlaps with the fourth light-emitting layer E5, the second light-emitting layer E2 overlaps with the fifth light-emitting layer E6, and the third light-emitting layer E3 overlaps with the sixth light-emitting layer E7. The differences between the display device 40 of FIG. 6 and the display device 30 of FIG. 4 will be described below, and the same or similar elements are denoted by the same or similar reference numerals, and the descriptions of the same technical content are omitted. The omitted portions are described in the previous embodiments and are not repeated in the following embodiments.

Referring to FIG. 6, in the display device 40, the first light-emitting element layer 104 may include an insulating layer L1, an electrode C5, and a pixel definition layer PDL5. In the present embodiment, the insulating layer L1 is located between the electrode C1 and the electrode A5 to provide an insulating function. The insulating layer L1 may be a single layer structure or a multi-layer structure, and the material may include an inorganic material, an organic material, or other suitable materials, wherein the inorganic material includes, for example, but not limited to: silicon oxide, silicon nitride or silicon oxynitride; the organic material includes, for example, but not limited to, polyimide resin, epoxy resin, or acrylic resin. In addition, in the present embodiment, the contact window H15 for electrically connecting the electrode A5 to the drain D5 of the fourth active element T5 is formed in the interlayer insulating layer IL2, the planarization layer PL, the pixel definition layer PDL1, and the insulating layer L1.

In the present embodiment, the fourth light-emitting layer E5 is located within a opening V8 of the pixel definition layer PDL5, but the present invention is not limited thereto. In other embodiments, the fourth light-emitting layer E5 may be located within the opening V8 of the pixel definition layer PDL5 and on the pixel definition layer PDL5. In the present embodiment, the opening V8 of the pixel definition layer PDL5 overlaps with the opening V1 of the pixel definition layer PDL1 in the normal direction N of the first substrate 100. In the present embodiment, the material of the pixel definition layer PDL5 may include a photosensitive polyimide material, a propylene-based material, a siloxane material, a phenolic resin material, an oxide, a nitride or an oxynitride, but the present invention is not limited thereto.

In the present embodiment, the electrode C5 is disposed on the fourth light-emitting layer E5. In the present embodiment, the fourth light-emitting layer E5 is disposed between the electrode A5 and the electrode C5. In this embodiment, the material of the electrode C5 may be a transparent conductive material or an opaque conductive material. The transparent conductive material may include a metal oxide conductive material such as indium tin oxide, indium zinc oxide, aluminum tin oxide, aluminum zinc oxide, indium antimony zinc oxide, other suitable oxides, or stacked layers of at least two of the above materials. The opaque conductive material may include a metallic material such as aluminum, magnesium, titanium or alloys thereof.

In the present embodiment, the fourth light-emitting element O5 includes the fourth light-emitting layer E5, the portion of the electrode A5 overlapping with the fourth light-emitting layer E5, and the portion of the electrode C5 overlapping with the fourth light-emitting layer E5. In the present embodiment, the portion of the electrode A5 overlapping with the fourth light-emitting layer E5 serves as an anode of the fourth light-emitting element O5, and the portion of the electrode C5 overlapping with the fourth light-emitting layer E5 serves as a cathode of the fourth light-emitting element O5, but the present invention is not limited thereto. In other embodiments, the portion of the electrode A5 overlapping with the fourth light-emitting layer E5 may serve as a cathode of the fourth light-emitting element O5, and the portion of the electrode C5 overlapping with the fourth light-emitting layer E5 may serve as an anode of the fourth light-emitting element O5. Further, in the present embodiment, the fourth light-emitting element O5 emits light by driving the fourth light-emitting layer E5 through the voltage difference generated between the electrode A5 and the electrode C5.

In the display device 40, the second light-emitting element layer 114 may include an insulating layer L2, an electrode C6, and a pixel definition layer PDL6. In the present embodiment, the insulating layer L2 is located between the electrode C2 and the electrode A6 to provide an insulating function. The insulating layer L2 may be a single layer structure or a multi-layer structure, and the material may include an inorganic material, an organic material, or other suitable materials, wherein the inorganic material includes, for example, but not limited to: silicon oxide, silicon nitride or silicon oxynitride; the organic material includes, for example, but not limited to, polyimide resin, epoxy resin, or acrylic resin. In the present embodiment, the contact window H18 for electrically connecting the electrode A6 and the drain D6 of the fifth active element T6 is formed in the interlayer insulating layer IL6, the planarization layer PL2, the pixel definition layer PDL2, and the insulating layer L2.

In the present embodiment, the fifth light-emitting layer E6 is located within an opening V9 of the pixel definition layer PDL6, but the present invention is not limited thereto. In other embodiments, the fifth light-emitting layer E6 may be located within the opening V9 of the pixel definition layer PDL6 and on the pixel definition layer PDL6. In the present embodiment, the opening V9 of the pixel definition layer PDL6 overlaps with the opening V2 of the pixel definition layer PDL2 in the normal direction N of the first substrate 100. In the present embodiment, the material of the pixel definition layer PDL6 may include a photosensitive polyimide material, a propylene-based material, a siloxane material, a phenolic resin material, an oxide, a nitride or an oxynitride, but the present invention is not limited thereto.

In the present embodiment, the electrode C6 is disposed on the fifth light-emitting layer E6. In the present embodiment, the fifth light-emitting layer E6 is disposed between the electrode A6 and the electrode C6. In this embodiment, the material of the electrode C6 may be a transparent conductive material or an opaque conductive material. The transparent conductive material may include a metal oxide conductive material such as indium tin oxide, indium zinc oxide, aluminum tin oxide, aluminum zinc oxide, indium antimony zinc oxide, other suitable oxides, or stacked layers of at least two of the above materials. The opaque conductive material may include a metallic material such as aluminum, magnesium, titanium or alloys thereof.

In the present embodiment, the fifth light-emitting element O6 includes the fifth light-emitting layer E6, the portion of the electrode A6 overlapping with the fifth light-emitting layer E6, and the portion of the electrode C6 overlapping with the fifth light-emitting layer E6. In the present embodiment, the portion of the electrode A6 overlapping with the fifth light-emitting layer E6 serves as an anode of the fifth light-emitting element O6, and the portion of the electrode C6 overlapping with the fifth light-emitting layer E6 serves as a cathode of the fifth light-emitting element O6, but the present invention is not limited thereto. In other embodiments, the portion of the electrode A6 overlapping with the fifth light-emitting layer E6 may serve as a cathode of the fifth light-emitting element O6, and the portion of the electrode C6 overlapping with the fifth light-emitting layer E6 may serve as an anode of the fifth light-emitting element O6. Further, in the present embodiment, the fifth light-emitting element O6 emits light by driving the fifth light-emitting layer E6 through the voltage difference generated between the electrode A6 and the electrode C6.

In the display device 40, the third light-emitting element layer 124 may include an insulating layer L3, an electrode C7, and a pixel definition layer PDL7. In the present embodiment, the insulating layer L3 is located between the electrode C3 and the electrode A7 to provide an insulating function. The insulating layer L3 may be a single layer structure or a multi-layer structure, and the material may include an inorganic material, an organic material, or other suitable materials, wherein the inorganic material includes, for example, but not limited to: silicon oxide, silicon nitride or silicon oxynitride; the organic material includes, for example, but not limited to, polyimide resin, epoxy resin, or acrylic resin. In the present embodiment, the contact window 21 for electrically connecting the electrodes A7 and the drain D7 of the sixth active element T7 is formed in the interlayer insulating layer IL8, the planarization layer PL3, the pixel definition layer PDL3, and the insulating layer L3.

In the present embodiment, the sixth light-emitting layer E7 is located within the opening V10 of the pixel definition layer PDL7, but the present invention is not limited thereto. In other embodiments, the sixth light-emitting layer E7 may be located within the opening V10 of the pixel definition layer PDL7 and on the pixel definition layer PDL7. In the present embodiment, the opening V10 of the pixel definition layer PDL7 overlaps with the opening V3 of the pixel definition layer PDL3 in the normal direction N of the first substrate 100. In the present embodiment, the material of the pixel definition layer PDL7 may include a photosensitive polyimide material, a propylene-based material, a siloxane material, a phenolic resin material, an oxide, a nitride or an oxynitride, but the present invention is not limited thereto.

In the present embodiment, the electrode C7 is disposed on the sixth light-emitting layer E7. In the present embodiment, the sixth light-emitting layer E7 is disposed between the electrode A7 and the electrode C7. In this embodiment, the material of the electrode C7 may be a transparent conductive material or an opaque conductive material. The transparent conductive material may include a metal oxide conductive material such as indium tin oxide, indium zinc oxide, aluminum tin oxide, aluminum zinc oxide, indium antimony zinc oxide, other suitable oxides, or stacked layers of at least two of the above materials. The opaque conductive material may include a metallic material such as aluminum, magnesium, titanium or alloys thereof.

In the present embodiment, the sixth light-emitting element O7 includes the sixth light-emitting layer E7, the portion of the electrode A7 overlapping with the sixth light-emitting layer E7, and the portion of the electrode C7 overlapping with the sixth light-emitting layer E7. In the present embodiment, the portion of the electrode A7 overlapping with the sixth light-emitting layer E7 serves as an anode of the sixth light-emitting element O7, and the portion of the electrode C7 overlapping with the sixth light-emitting layer E7 serves as a cathode of the sixth light-emitting element O7, but the present invention is not limited thereto. In other embodiments, the portion of the electrode A7 overlapping with the sixth light-emitting layer E7 may serve as a cathode of the sixth light-emitting element O7, and the portion of the electrode C7 overlapping with the sixth light-emitting layer E7 may serve as an anode of the sixth light-emitting element O7. Further, in the present embodiment, the sixth light-emitting element O7 emits light by driving the sixth light-emitting layer E7 through the voltage difference generated between the electrode A7 and the electrode C7. For the rest, please refer to the foregoing embodiments, and details are not described herein.

In addition, in the display device 30, the first light-emitting element O1 and the fourth light-emitting element O5 both are disposed in the same light-emitting element layer (i.e. the first light-emitting element layer 104), the second light-emitting element O2 and the fifth light-emitting element O6 both are disposed in the same light-emitting element layer (i.e. the second light-emitting element layer 114), the third light-emitting element O3 and the sixth light-emitting element O7 both are disposed in the same light-emitting element layer (i.e. the third light-emitting element layer 124), but the present invention is not limited thereto. Hereinafter, other embodiments will be described with reference to FIG. 7. It should be mentioned here that, the embodiments below adopt the reference numerals of the embodiments above and a portion of the content thereof, wherein the same or similar reference numerals are used to represent the same or similar elements and descriptions of the same technical content are omitted. The omitted portions are described in the previous embodiments and are not repeated in the following embodiments.

Figure 7:
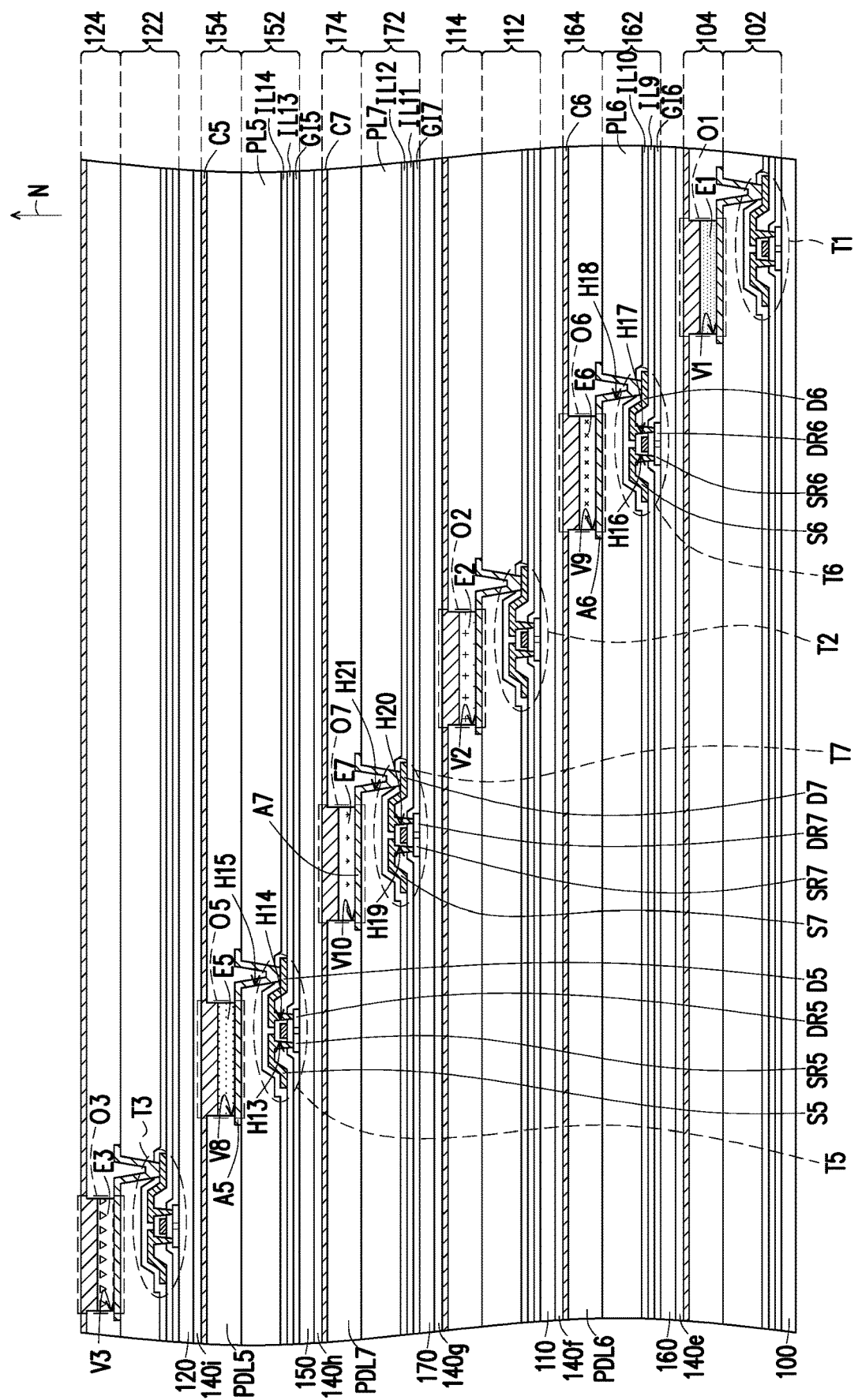
FIG. 7 is a schematic cross-sectional view of a display device in accordance with another embodiment of the present invention.

FIG. 7 is a schematic cross-sectional view of a display device in accordance with another embodiment of the present invention. Referring to both FIG. 7 and FIG. 6, the display device 50 of FIG. 7 is similar to the display device 40 of FIG. 6, and the main difference is that in the display device 50, the first light-emitting element O1, the fifth light-emitting element O6, the second light-emitting element O2, the sixth light-emitting element O7, the fourth light-emitting element O5, and the third light-emitting element O3 are respectively disposed in the corresponding light-emitting element layers (i.e. the first light-emitting element layer 104, the fifth light-emitting element layer 164, the second light-emitting element layer 114, the sixth light-emitting element layer 174, the fourth light-emitting element layer 154, and the third light-emitting element layer 124). The differences between the display device 50 of FIG. 7 and the display device 40 of FIG. 6 will be described below, and the same or similar elements are denoted by the same or similar reference numerals, and the descriptions of the same technical content are omitted. The omitted portions are described in the previous embodiments and are not repeated in the following embodiments.

Referring to FIG. 7, in the embodiment, the display device 50 may include a fourth substrate 150, a fourth element layer 152, a fourth light-emitting element layer 154, a fifth substrate 160, a fifth element layer 162, a fifth light-emitting element layer 164, a sixth substrate 170, a sixth element layer 172, a sixth light-emitting element layer 174, and adhesive layers 140e-140i.

In this embodiment, the materials of the fourth substrate 150, the fifth substrate 160, and the sixth substrate 170 may respectively include, but not limited to, glass, quartz, silicon oxide, silicon nitride, silicon oxynitride or an organic polymer. The organic polymer includes, for example, polyimide resin, epoxy resin, or acrylic resin. In the present embodiment, each of the fourth substrate 150, the fifth substrate 160, and the sixth substrate 170 has a single layer structure, but the present invention is not limited thereto. In other embodiments, each of the fourth substrate 150, the fifth substrate 160, and the sixth substrate 170 may have a multilayer structure.

In the present embodiment, the fifth substrate 160 is disposed on the first light-emitting element layer 104. That is, in the present embodiment, the fifth substrate 160 is stacked on the first substrate 100, the first element layer 102, and the first light-emitting element layer 104 in the normal direction N of the first substrate 100. In the present embodiment, the fifth element layer 162 is disposed on the fifth substrate 160. In the present embodiment, the fifth element layer 162 may include the fifth active element T6, a gate insulating layer GI6, an interlayer insulating layer IL9, an interlayer insulating layer IL10, and a planarization layer PL6.

In the present embodiment, the contact window H16 for electrically connecting the source S6 of the fifth active element T6 to the source region SR6 is formed in the gate insulating layer GI6 and the interlayer insulating layer IL9, the contact window H17 for electrically connecting the drain D6 of the fifth active element T6 to the drain region DR6 is formed in the gate insulating layer GI6 and the interlayer insulating layer IL9. In the present embodiment, the gate insulating layer GI6 covers the semiconductor layer SC6. In the present embodiment, the interlayer insulating layer IL9 is disposed on the gate insulating layer GI6 and covers the gate G6. In the present embodiment, the interlayer insulating layer IL10 is disposed on the interlayer insulating layer IL9 and covers the fifth active element T6 to provide insulation and protection functions. In the present embodiment, the planarization layer PL6 is disposed on the interlayer insulating layer IL10 to provide protection function and ensure planarization. In the present embodiment, the gate insulating layer GI6, the interlayer insulating layer IL9, the interlayer insulating layer IL10, and the planarization layer PL6 may each have a single layer structure or a multilayer structure. In the present embodiment, the materials of the gate insulating layer GI6, the interlayer insulating layer IL9, the interlayer insulating layer IL10, and the planarization layer PL6 may respectively include an inorganic material, an organic material, or other suitable materials, wherein the inorganic material includes, for example, but not limited to: silicon oxide, silicon nitride or silicon oxynitride; the organic material includes, for example, but not limited to: polyimide resin, epoxy resin or acrylic resin.

In the present embodiment, the fifth light-emitting element layer 164 is disposed on the fifth element layer 162. In the present embodiment, the fifth light-emitting element layer 164 may include the electrode A6, the fourth light-emitting layer E6, the electrode C6, and the pixel definition layer PDL6. In the present embodiment, the contact window H18 for electrically connecting the electrode A6 to the drain D6 of the fifth active element T6 is formed in the interlayer insulating layer IL12 and the planarization layer PL6.

In the present embodiment, the adhesive layer 140e is disposed between the first light-emitting element layer 104 and the fifth substrate 160. That is, in the present embodiment, the fifth substrate 160 is adhered and fixed to the first light-emitting element layer 104 through the adhesive layer 140e. In addition, in the embodiment, the adhesive layer 140e may be a continuous adhesive layer, wherein the material of the adhesive layer may include, but not limited to, a photo-curable adhesive, an optical clear adhesive or other adhesive materials.

In the present embodiment, the second substrate 110 is disposed on the fifth light-emitting element layer 164. That is, in the present embodiment, the second substrate 110 is stacked on the first substrate 100, the first element layer 102, the first light-emitting element layer 104, the fifth substrate 160, the fifth element layer 162 and the fifth light-emitting element layer 164 in the normal direction N of the first substrate 100.

In the present embodiment, the adhesive layer 140f is disposed between the fifth light-emitting element layer 164 and the second substrate 110. That is, in the present embodiment, the second substrate 110 is adhered and fixed to the fifth light-emitting element layer 164 through the adhesive layer 140f. In addition, in the embodiment, the adhesive layer 140f may be a continuous adhesive layer, wherein the material of the adhesive layer may include, but not limited to, a photo-curable adhesive, an optical clear adhesive or other adhesive materials.

In the present embodiment, the sixth substrate 170 is disposed on the second light-emitting element layer 114. That is, in the present embodiment, the sixth substrate 170 is stacked on the first substrate 100, the first element layer 102, the first light-emitting element layer 104, the fifth substrate 160, the fifth element layer 162, the fifth light-emitting element layer 164, the second substrate 110, the second element layer 112, and the second light-emitting element layer 114 in the normal direction N of the first substrate 100. In the present embodiment, the sixth element layer 172 is disposed on the sixth substrate 170. In the present embodiment, the sixth element layer 172 may include the sixth active element T7, a gate insulating layer GI7, an interlayer insulating layer IL11, an interlayer insulating layer IL12, and a planarization layer PL7.

In the present embodiment, the contact window H19 for electrically connecting the source S7 of the sixth active element T7 to the source region SR7 is formed in the gate insulating layer GI7 and the interlayer insulating layer IL11, the contact window H20 for electrically connecting the drain D7 of the sixth active element T7 to the drain region DR7 is formed in the gate insulating layer GI7 and the interlayer insulating layer IL11. In the present embodiment, the gate insulating layer GI7 covers the semiconductor layer SC7. In the present embodiment, the interlayer insulating layer IL11 is disposed on the gate insulating layer GI7 and covers the gate G7. In the present embodiment, the interlayer insulating layer IL12 is disposed on the interlayer insulating layer IL11 and covers the sixth active element T7 to provide insulation and protection functions. In the present embodiment, the planarization layer PL7 is disposed on the interlayer insulating layer IL12 to provide protection function and ensure planarization. In the present embodiment, the gate insulating layer GI7, the interlayer insulating layer IL11, the interlayer insulating layer IL12, and the planarization layer PL7 may each have a single layer structure or a multilayer structure. In the present embodiment, the materials of the gate insulating layer GI7, the interlayer insulating layer IL11, the interlayer insulating layer IL12, and the planarization layer PL7 may respectively include an inorganic material, an organic material, or other suitable materials, wherein the inorganic material includes, for example, but not limited to: silicon oxide, silicon nitride or silicon oxynitride; the organic material includes, for example, but not limited to: polyimide resin, epoxy resin or acrylic resin.

In the present embodiment, the sixth light-emitting element layer 174 is disposed on the sixth element layer 172. In the present embodiment, the sixth light-emitting element layer 174 may include the electrode A7, the sixth light-emitting layer E7, the electrode C7, and the pixel definition layer PDL7. In the present embodiment, the contact window H21 for electrically connecting the electrode A7 to the drain D7 of the sixth active element T7 is formed in the interlayer insulating layer IL12 and the planarization layer PL7.

In the present embodiment, the adhesive layer 140g is disposed between the second light-emitting element layer 114 and the sixth substrate 170. That is, in the present embodiment, the sixth substrate 170 is adhered and fixed to the second light-emitting element layer 114 through the adhesive layer 140g. In addition, in the embodiment, the adhesive layer 140g may be a continuous adhesive layer, wherein the material of the adhesive layer may include, but not limited to, a photo-curable adhesive, an optical clear adhesive or other adhesive materials.

In the present embodiment, the fourth substrate 150 is disposed on the sixth light-emitting element layer 174. That is, in the present embodiment, the fourth substrate 150 is stacked on the first substrate 100, the first element layer 102, the first light-emitting element layer 104, the fifth substrate 160, the fifth element layer 162, the fifth light-emitting element layer 164, the second substrate 110, the second element layer 112, the second light-emitting element layer 114, the sixth substrate 170, the sixth element layer 172, and the sixth light-emitting element layer 174 in the normal direction N of the first substrate 100. In the present embodiment, the fourth element layer 152 is disposed on the fourth substrate 150. In the present embodiment, the fourth element layer 152 may include the fourth active element T5, a gate insulating layer GI5, an interlayer insulating layer IL13, an interlayer insulating layer IL14, and a planarization layer PL5.

In the present embodiment, the contact window H13 for electrically connecting the source S5 of the fourth active element T5 to the source region SR5 is formed in the gate insulating layer GI5 and the interlayer insulating layer IL13, the contact window H14 for electrically connecting the drain D5 of the element T5 to the drain region DR5 is formed in the gate insulating layer GI5 and the interlayer insulating layer IL13. In the present embodiment, the gate insulating layer GI5 covers the semiconductor layer SC5. In the present embodiment, the interlayer insulating layer IL13 is disposed on the gate insulating layer GI5 and covers the gate G5. In the present embodiment, the interlayer insulating layer IL14 is disposed on the interlayer insulating layer IL13 and covers the fourth active element T5 to provide insulation and protection functions. In the present embodiment, the planarization layer PL5 is disposed on the interlayer insulating layer IL14 to provide protection function and ensure planarization. In the present embodiment, the gate insulating layer GI5, the interlayer insulating layer IL13, the interlayer insulating layer IL14, and the planarization layer PL5 may each have a single layer structure or a multilayer structure. In the present embodiment, the materials of the gate insulating layer GI5, the interlayer insulating layer IL13, the interlayer insulating layer IL14, and the planarization layer PL5 may respectively include an inorganic material, an organic material, or other suitable materials, wherein the inorganic material includes, for example, but not limited to): silicon oxide, silicon nitride or silicon oxynitride; the organic material includes, for example, but not limited to: polyimide resin, epoxy resin or acrylic resin.

In the present embodiment, the fourth light-emitting element layer 154 is disposed on the fourth element layer 152. In the present embodiment, the fourth light-emitting element layer 154 may include the electrode A5, the fourth light-emitting layer E5, the electrode C5, and the pixel definition layer PDL5. In the present embodiment, the contact window H15 for electrically connecting the electrode A5 to the drain D5 of the fourth active element T5 is formed in the interlayer insulating layer IL14 and the planarization layer PL5.

In the present embodiment, the adhesive layer 140h is disposed between the sixth light-emitting element layer 174 and the fourth substrate 150. That is, in the present embodiment, the fourth substrate 150 is adhered and fixed to the sixth light-emitting element layer 174 through the adhesive layer 140h. In addition, in the embodiment, the adhesive layer 140h may be a continuous adhesive layer, wherein the material of the adhesive layer may include, but not limited to, a photo-curable adhesive, an optical clear adhesive or other adhesive materials.

In the present embodiment, the third substrate 120 is disposed on the fourth light-emitting element layer 154. That is, in the present embodiment, the third substrate 120 is stacked on the first substrate 100, the first element layer 102, the first light-emitting element layer 104, the fifth substrate 160, the fifth element layer 162, the fifth light-emitting element layer 164, the second substrate 110, the second element layer 112, the second light-emitting element layer 114, the sixth substrate 170, the sixth element layer 172, the sixth light-emitting element layer 174, the fourth substrate 150, the fourth element layer 152, and the fourth light-emitting element layer 154 in the normal direction N of the first substrate 100.

In the present embodiment, the adhesive layer 140i is disposed between the fourth light-emitting element layer 154 and the third substrate 120. That is, in the present embodiment, the third substrate 120 is adhered and fixed to the fourth light-emitting element layer 154 through the adhesive layer 140i. In addition, in the embodiment, the adhesive layer 140i may be a continuous adhesive layer, wherein the material of the adhesive layer may include, but not limited to, a photo-curable adhesive, an optical clear adhesive or other adhesive materials.

In the display device 50, the colors of the first light-emitting layer E1, the fifth light-emitting layer E6, the second light-emitting layer E2, the sixth light-emitting layer E7, the fourth light-emitting layer E5 and the third light-emitting layer E3 sequentially disposed from the first substrate 100 from bottom to top are the blue color, the cyan color, the green color, the yellow color, the magenta color, and the red color, respectively. Since the energy of the blue wavelength light is the strongest, the light transmittance of the display device 50 is optimized by placing the light-emitting layer which would emit the blue wavelength light (i.e. the first light-emitting layer E1) at the lower location. However, the present invention is not limited thereto. In other embodiments, the arrangements of the color of the first light-emitting layer E1, the color of the second light-emitting layer E2, the color of the third light-emitting layer E3, the color of the fourth light-emitting layer E5, the color of the five light-emitting layers E6 and the color of the sixth light-emitting layer E7 may be implemented by other arrangements of the blue color, the green color, the red color, the magenta color, the cyan color, and the yellow color.

In addition, in the display device 50, in the normal direction N of the first substrate 100, the first light-emitting layer E1, the second light-emitting layer E2, the third light-emitting layer E3, the fourth light-emitting layer E5, the fifth light-emitting layer E6 and the sixth light-emitting layers E7 do not overlap with each other. That is, in the present embodiment, in the normal direction N of the first substrate 100, the opening V1 of the pixel definition layer PDL1, the opening V2 of the pixel definition layer PDL2, the opening V3 of the pixel definition layer PDL3, the opening V8 of the prime defining layer PDL5, the opening V9 of the pixel definition layer PDL6 and the opening V10 of the pixel definition layer PDL7 do not overlap with each other. For the rest, please refer to the foregoing embodiments, and details are not described herein.

In addition, referring to FIG. 4, in the display device 30, the blue light I1 and the magenta light I5 pass through the adhesive layer 140d, the second substrate 110, the second element layer 112, the second light-emitting element layer 114, the adhesive layer 140c, the third substrate 120, the third element layer 122, and the third light-emitting element layer 124 after being emitted respectively from the first light-emitting element O1 and the fourth light-emitting element O5, the green light I2 and the cyan light I6 pass through the adhesive layer 140c, the third substrate 120, the third element layer 122, and the third light-emitting element layer 124 after being emitted respectively from the second light-emitting element O2 and the fifth light-emitting element O6, but the present invention is not limited thereto. Hereinafter, other embodiments will be described with reference to FIG. 8. It should be mentioned here that, the embodiments below adopt the reference numerals of the embodiments above and a portion of the content thereof, wherein the same or similar reference numerals are used to represent the same or similar elements and descriptions of the same technical content are omitted. The omitted portions are described in the previous embodiments and are not repeated in the following embodiments.

Figure 8:
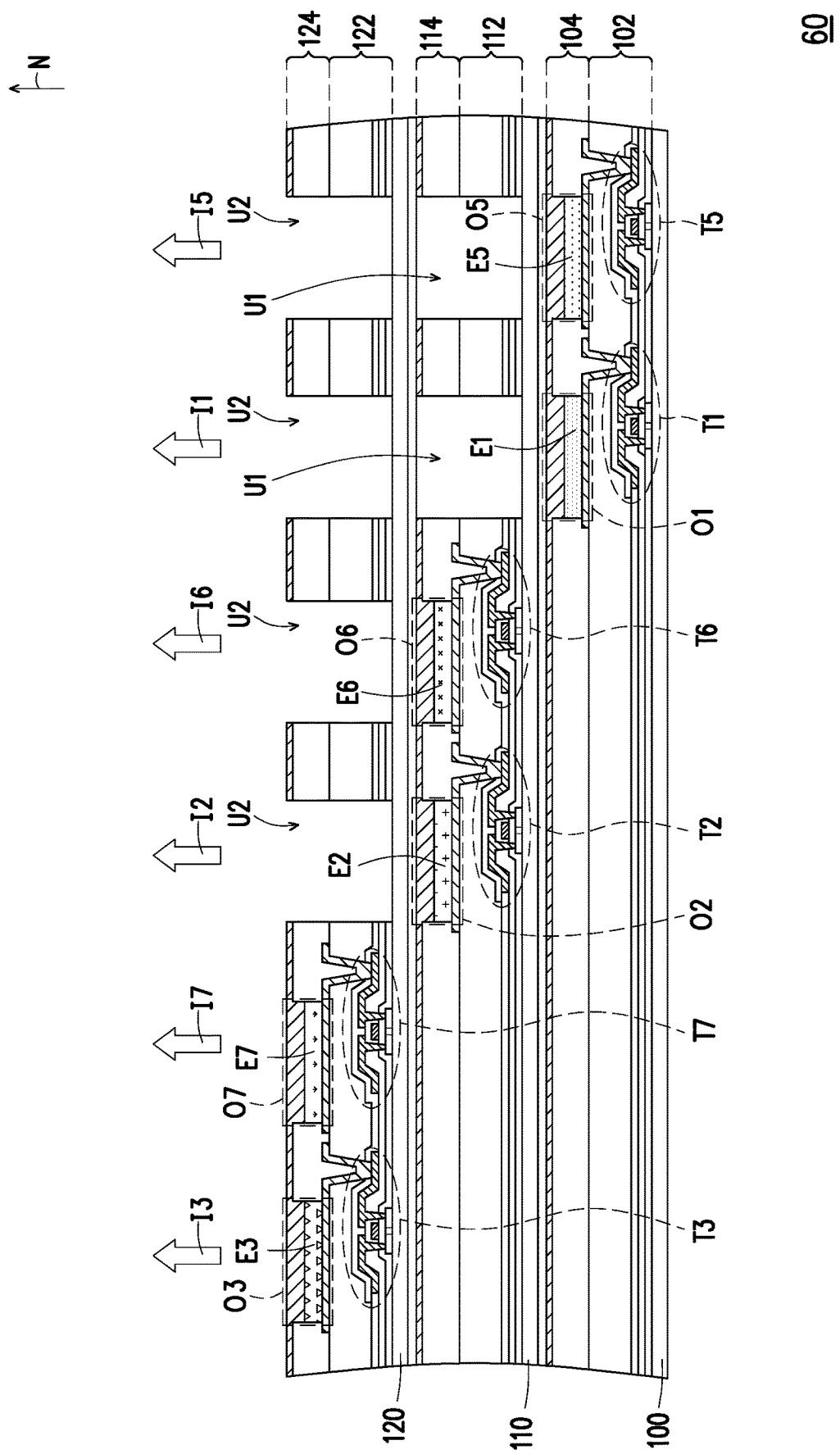
FIG. 8 is a schematic cross-sectional view of a display device in accordance with another embodiment of the present invention.

FIG. 8 is a schematic cross-sectional view of a display device in accordance with another embodiment of the present invention. Referring to both FIG. 8 and FIG. 4, the display device 60 of FIG. 8 is similar to the display device 30 of FIG. 4, and therefore the same or similar elements are denoted by the same or similar reference numerals, and the descriptions of the same technical content are omitted. The omitted portions are described in the previous embodiments and are not repeated in the following embodiments.

Referring to FIG. 8, in the embodiment, the second element layer 112 and the second light-emitting element layer 114 have a plurality of first opening patterns U1, and the third element layer 122 and the third light-emitting element layer 124 have a plurality of second opening pattern U2. In detail, in the present embodiment, in the normal direction N of the first substrate 100, the first light-emitting layer E1, the first opening pattern U1 and the second opening pattern U2 overlap with each other, the fourth light-emitting layer E5, the first opening pattern U1 and the second opening pattern U2 overlap with each other, the second light-emitting layer E2 and the second opening pattern U2 overlap with each other, and the fifth light-emitting layer E6 and the second opening pattern U2 overlap with each other. In this manner, in the display device 60, the blue light I1 and the magenta light I5 do not pass through the second element layer 112, the second light-emitting element layer 114, the third element layer 122 and the third light-emitting element layer 124 after being emitted respectively from the first light-emitting element O1 and the fourth light-emitting element O5, the green light I2 and the cyan light I6 do not pass through the third element layer 122 and the third light-emitting element layer 124 after being emitted respectively from the second light-emitting element O2 and the fifth light-emitting element O6. Thereby, the effect of improving the light transmittance may be achieved. In addition, in the present embodiment, the first opening patterns U1 are disposed at a region where elements and traces are not arranged in the second element layer 112 and the second light-emitting element layer 114, and the second opening patterns U2 are disposed at a region where elements and traces are not arranged in the third element layer 122 and the third light-emitting element layer 124.

In addition, when the display device 60 is a flexible display device, since the display device 60 includes the first opening patterns U1 and the second opening patterns U2, the effect of improving flexibility may be achieved.

It should be noted that, according to the foregoing descriptions of the display device 60, any one of ordinary skill in the art should understand that the display device 10, the display device 20, the display device 40, and the display device 50 can all be disposed the opening patterns to achieve the effect of improving light transmittance and/or improving flexibility. For the rest, please refer to the foregoing embodiments, and details are not described herein.

Based on the above, in a display device according to at least one embodiment of the present invention, the first element layer is disposed on the first substrate and includes a first active element, the first light-emitting element layer is disposed on the first element layer and includes the first light-emitting element electrically connected to the first active element, the second substrate is disposed on the first light-emitting element, the second element layer is disposed on the second substrate and includes the second active element, the second light-emitting element layer is disposed on the second element layer and includes the second light-emitting element electrically connected to the second active element, the third substrate is disposed on the second light-emitting element, the third element layer is disposed on the third substrate and includes the third active element, the third light-emitting element is disposed on the third element layer and includes the third light-emitting element electrically connected to the third active element, and the first light-emitting layer of the first light-emitting element, the second light-emitting layer of the second light-emitting element, and the third light-emitting layer of the third light-emitting element do not overlap with each other in the normal direction of the first substrate, whereby the display device may have improved resolution.

The present invention has been disclosed in the above embodiments, and is not intended to limit the present invention. Any one of ordinary skill in the art can make some changes and refinements without departing from the spirit and scope of the present invention. The scope of the invention is defined by the scope of the appended claims.

What is claimed is:

1. A display device, comprising:
a first substrate;
a first element layer disposed on the first substrate and including a first active element;
a first light-emitting element layer disposed on the first element layer, wherein the first light-emitting element layer includes a first light-emitting element, electrically connected to the first active element, and includes a first light-emitting layer;
a second substrate disposed on the first light-emitting element;
a second element layer disposed on the second substrate and including a second active element;
a second light-emitting element layer disposed on the second element layer, wherein the second light-emitting element layer includes a second light-emitting element, electrically connected to the second active element, and includes a second light-emitting layer;
a third substrate disposed on the second light-emitting element;
a third element layer disposed on the third substrate and including a third active element;
a third light-emitting element layer disposed on the third element layer, wherein the third light-emitting element layer includes a third light-emitting element, electrically connected to the third active element, and includes a third light-emitting layer,
wherein the first light-emitting layer, the second light-emitting layer and the third light-emitting layer do not overlap with each other in a normal direction of the first substrate,
wherein the first element layer further includes a fourth active element, the first light-emitting element layer further includes a fourth light-emitting element, the fourth active element is electrically connected to the fourth light-emitting element, and the fourth light-emitting element includes a fourth light-emitting layer;
the second element layer further includes a fifth active element, the second light- emitting element layer further includes a fifth light-emitting element, the fifth active element is electrically connected to the fifth light-emitting element, and the fifth light- emitting element includes a fifth light-emitting layer; the third element layer further includes a sixth active element;
the third light- emitting element layer further includes a sixth light-emitting element, the sixth active element is electrically connected to the sixth light-emitting element, and the sixth light-emitting element includes a sixth light-emitting layer,
wherein the first light-emitting layer overlaps the fourth light-emitting layer, the second light-emitting layer overlaps the fifth light-emitting layer, and the third light- emitting layer overlaps the sixth light-emitting layer in the normal direction of the first substrate; and wherein a color of the first light- emitting layer is a blue color, a color of the second light-emitting layer is a green color, a color of the third light-emitting layer is a red color, a color of the fourth light-emitting layer is a magenta color, a color of the fifth light-emitting layer is a cyan color, and a color of the sixth light-emitting layer is a yellow color.

2. The display device of claim 1, wherein: when in a first time, the first light-emitting element is driven to emit light by the turned-on first active element, the second light-emitting element is driven to emit light by the turned-on second active element, and the third light-emitting element is driven to emit light by the turned-on third active element; and when in a second time, the third active element is turned off, the first light-emitting element is driven to emit light by the turned-on first active element, the second light- emitting element is driven to emit light by the turned-on second active element, and the four light-emitting element is driven to emit light by the turned-on fourth active element.

3. The display device of claim 1, wherein the first light-emitting layer, the second light-emitting layer, the third light-emitting layer, the fourth light-emitting layer, the fifth light-emitting layer and the sixth light-emitting layer do not overlap with each other in the normal direction of the first substrate.

4. The display device of claim 1, wherein:
when in a first time, the first light-emitting element is driven to emit light by the turned-on first active element, the second light-emitting element is driven to emit light by the turned-on second active element, and the third light-emitting element is driven to emit light by the turned-on third active element; and
when in a second time, the first active element, the second active element, and the third active element are turned off, the fourth light-emitting element is driven to emit light by the turned-on fourth active element, the fifth light-emitting element is driven to emit light by the turned-on fifth active element and the sixth light-emitting element is driven to emit light by the turned-on sixth active element.

5. The display device of claim 1, wherein the first light-emitting dement layer and the fourth light-emitting element layer emit light at different times.

6. A display device, comprising:
a first substrate;
a first element layer disposed on the first substrate and including a first active element;
a first light-emitting element layer disposed on the first element layer, wherein the first light-emitting element layer includes a first light-emitting element, electrically connected to the first active element, and includes a first light-emitting layer;
a second substrate disposed on the first light-emitting element;
a second element layer disposed on the second substrate and including a second active element;
a second light-emitting element layer disposed on the second element layer, wherein the second light-emitting element layer includes a second light-emitting element, electrically connected to the second active element, and includes a second light-emitting layer;
a third substrate disposed on the second light-emitting element;
a third element layer disposed on the third substrate and including a third active element;
a third light-emitting element layer disposed on the third element layer, wherein the third light-emitting element layer includes a third light-emitting element, electrically connected to the third active element, and includes a third light-emitting layer,
wherein the first light-emitting layer, the second light-emitting layer and the third light-emitting layer do not overlap with each other in a normal direction of the first substrate;
a fourth substrate;
a fourth element layer disposed on the fourth substrate and including a fourth active element;
a fourth light-emitting element layer disposed on the fourth element layer, wherein the fourth light-emitting element layer includes a fourth light-emitting element, electrically connected to the fourth active element, and including a fourth light-emitting layer;
a fifth substrate;
a fifth element layer disposed on the fifth substrate and including a fifth active element;
a fifth light-emitting element layer disposed on the fifth element layer, wherein the fifth light-emitting element layer includes a fifth light-emitting element, electrically connected to the fifth active element and including a fifth light-emitting layer;
a sixth substrate disposed on the fifth light-emitting element layer;
a sixth element layer disposed on the sixth substrate and including a sixth active element; and
a sixth light-emitting element layer disposed on the sixth element layer, wherein the sixth light-emitting element layer includes a sixth light-emitting element, electrically connected to the sixth active element, and including a sixth light-emitting layer,
wherein the fifth substrate, the fifth element layer and the fifth light-emitting element layer are located between the first light-emitting element layer and the second substrate, the sixth substrate, the sixth element layer and the sixth light-emitting element layer are located between the second light-emitting element layer and the fourth substrate, and the fourth substrate, the fourth element layer and the fourth light-emitting element layer are located between the sixth light-emitting element layer and the third substrate.

7. The display device of claim 6, wherein colors of the first light-emitting layer, the second light-emitting layer, the third light-emitting layer, the fourth light-emitting layer, the fifth light-emitting layer, and the sixth illuminating are different from each other.

8. The display device of claim 7, wherein a color of the first light-emitting layer is blue color, a color of the second light-emitting layer is a green color, a color of the third light-emitting layer is a red color, a color of the fourth light-emitting layer is a magenta color, a color of the fifth light-emitting layer is a cyan color, and a color of the sixth light-emitting layer is a yellow color.

9. The display device of claim 7, wherein the first light-emitting layer, the second light-emitting layer, the third light-emitting layer, the fourth light-emitting layer, the fifth light-emitting layer and the sixth light-emitting layer do not overlap with each other in the normal direction of the first substrate.

10. The display device of claim 6, wherein:
when in a first time, the first light-emitting element is driven to emit light by the turned-on first active element, the second light-emitting element is driven to emit light by the turned-on second active element, and the third light-emitting element is driven to emit light by the turned-on third active element; and when in a second time, the first active element, the second active element, and the third active element are turned off, the fourth light-emitting element is driven to emit light by the turned-on fourth active element, the fifth light-emitting element is driven to emit light by the turned-on fifth active element and the sixth light-emitting element is driven to emit light by the turned-on sixth active element.

\* \* \* \* \*